US 011527566B2

(12) United States Patent
Löertscher et al.

(10) Patent No.: US 11,527,566 B2
(45) Date of Patent: Dec. 13, 2022

(54) INTERPRETING OPTICAL SIGNALS FROM TAILORED ARRAYS OF METASURFACES

(71) Applicant: International Business Machines Corporation, Armonk, NY (US)

(72) Inventors: Emanuel Marc Löertscher, Bonstetten (CH); Gero Dittmann, Zürich (CH)

(73) Assignee: International Business Machines Corporation, Armonk, NY (US)

( * ) Notice: Subject to any disclaimer, the term of this patent is extended or adjusted under 35 U.S.C. 154(b) by 393 days.

(21) Appl. No.: 16/936,489

(22) Filed: Jul. 23, 2020

(65) Prior Publication Data

US 2022/0028911 A1 Jan. 27, 2022

(51) Int. Cl.
*H01L 27/146* (2006.01)
*H01L 27/148* (2006.01)
(Continued)

(52) U.S. Cl.
CPC .......... *H01L 27/14625* (2013.01); *G06K 9/00* (2013.01); *H01L 27/14643* (2013.01); *H01L 27/14806* (2013.01)

(58) Field of Classification Search
CPC .......... G02B 1/002; G02B 1/005; G02B 1/00; G02F 2202/30; H01L 27/14625;
(Continued)

(56) References Cited

U.S. PATENT DOCUMENTS

| 2016/0156090 A1 | 6/2016 | Campione |
| 2017/0063039 A1 | 3/2017 | Sinclair |

(Continued)

FOREIGN PATENT DOCUMENTS

| CN | 111258059 B | 9/2021 |
| EP | 3534288 A2 | 4/2019 |
| WO | 2020112266 A1 | 6/2020 |

OTHER PUBLICATIONS

Neshev D. et al., "Optical metasurfaces: new generation building blocks for multi-functional optics", Neshev and Aharonovich Light: Science & Applications, 5 pages (Aug. 29, 2018).

(Continued)

*Primary Examiner* — Edward F Urban
*Assistant Examiner* — Wassim Mahrouka
(74) *Attorney, Agent, or Firm* — Mark Bergner

(57) ABSTRACT

A system and method interpret optical characterization examinations performed with a set of optical devices. Each device comprises one or more arrays of optical metasurface structures and have arrays tailored to have distinct properties making them differ from one another. First data and second data are accessed that capture a physical fingerprint of each device and an outcome of an optical characterization examination performed with each device, respectively. The outcomes of examinations performed are impacted by the respective, distinct properties of the arrays. Each device is identified based on the first data accessed, which makes it possible to obtain a readout key associated with the identified device. This readout key accounts for the respective one of the distinct properties. Finally, the second data are interpreted according to the readout key obtained to elucidate the outcome of the optical characterization examination. The invention is further directed to related computer program products.

20 Claims, 9 Drawing Sheets

(51) Int. Cl.
*G06K 9/00* (2022.01)
*G02B 1/00* (2006.01)
*G02B 1/02* (2006.01)

(58) Field of Classification Search
CPC ........ H01L 27/14643; H01L 27/14806; G06K 9/00; G06V 10/147
See application file for complete search history.

(56) References Cited

U.S. PATENT DOCUMENTS

2017/0134174 A1* 5/2017 Cambou ................ G02B 1/002
2018/0248268 A1  8/2018 Shvets
2020/0025975 A1* 1/2020 Kamali .................... G02B 1/02

OTHER PUBLICATIONS

Zhang et. al., "Multichannel Metasurfaces for Anticounterfeiting", Physical Review Applied 12, 8 pages (Sep. 13, 2019).
"Luxury Ledger and IBM Crypto-Anchors unite against Counterfeits", published in Medium, Aug. 29, 2018, 2 pages, found at: medium.com/@LuxuryLedger/luxury-ledger-and-ibm-crypto-anchors-unite-against-counterfeits-bdd3843f4ee2.
Rojas, "IBM Crypto-Anchor Verifier—BLOCKCHAIN—Pairing AI with Optical Scanning for Real-World Product Authentication", published in Steemit, 7 pages, found at: www.cs.utah.edu/~lifeifei/papers/deeplog.pdf.
Liu B. et al., "Two-Dimensional Optical Metasurfaces: From Plasmons to Dielectrics", published in Advances in Condensed Matter Physics, 16 pages (Jan. 10, 2019).
Genevet P. et al., "Recent advances in planar optics: from plasmonic to dielectric metasurfaces," Optica 4, 2334-2536, 14 pages (2017).
Wang et al., "Metasurfaces for Spatial Light Manipulation" in "Metamaterials—Devices and Applications", Edited by Alejandro Lucas Borja, DOI: 10.5772/62750, ISBN: 978-953-51-3100-7, Published Apr. 26, 2017.
Rybin et al., "Supercavity lasing", Nature 541, pp. 164-165 (2017).
Tittl et al., "Imaging-based molecular barcoding with pixelated dielectric metasurfaces", Science 360, pp. 1105-1109 (2018).
Balagurusamy V.S.K. et al., "Crypto anchors," in IBM Journal of Research and Development, vol. 63, No. 2/3, pp. 4:1-4:12, Mar.-May 2019.
Mell, P. et al., "The NIST Definition of Cloud Computing", Recommendations of the National Institute of Standards and Technology, NIST Special Publication 800-145, 7 pages, Sep. 2011.
PCT/IB2021/056236 International Search Report and Written Opinion, dated Oct. 18, 2021.

* cited by examiner

INTERPRETING OPTICAL SIGNALS FROM TAILORED ARRAYS OF METASURFACES

BACKGROUND

The present disclosure relates in general to techniques for interpreting optical characterization examinations performed with several optical devices. In particular, it concerns methods based on devices with arrays of optical metasurface structures, where the arrays are tailored to have distinct properties, which act as configured secrets, and where physical fingerprints of devices are additionally exploited to authenticate the devices.

SUMMARY

According to a first aspect, a method for examining a set of optical devices is provided. Each device comprises one or more arrays of optical metasurface structures. The devices are tailored such that their respective arrays have distinct properties. The optical devices accordingly differ from each other, by virtue of the distinct properties of the arrays. The present method comprises a series of steps, which are performed for each device of the set. To start with, first data and second data are accessed (e.g., by a server), which capture a physical fingerprint of each device and an outcome of an optical characterization examination performed with each device, respectively. As the devices have distinct properties, the outcomes of examinations performed with them are impacted by the respective, distinct properties of the arrays. That is, the outcome of a characterization examination performed with a given device of the set is impacted by a respective one of the distinct properties. Each device is identified based on the first data accessed, which, in turn, makes it possible to obtain a readout key associated with the identified device. This readout key accounts for the respective one of the distinct properties. Finally, the second data are interpreted according to the readout key obtained to elucidate the outcome of the optical characterization examination. This outcome may then be provided to an examining device.

An optical characterization examination performed with an optical device that includes distinct arrays may give rise to the formation of distinct or merged optical signals (owing to the distinct arrays). All such signals accordingly impact or somehow form part of the outcome of this examination.

The present method allows two levels of security to be achieved. First, the physical fingerprint of each optical device is difficult, if not impossible, to clone, such that each optical device can be unambiguously identified. Second, readout keys can only be obtained for those devices that have been duly identified. Also, the users of the devices may possibly be authenticated during the process. Thus, only the legitimate devices (and possibly the authenticated users) may be able to, e.g., cause a server to suitably interpret results or provide analytical information to interpret the data obtained with the tailored optical devices.

In some embodiments, the outcome is impacted by both the respective one of the distinct properties and the physical fingerprint of each device. In that case, the respective readout key may have been devised to account for both the respective one of the distinct properties and the physical fingerprint of each device. In addition, accessing the first and second data may first comprise receiving characterization data. In that case, the first and second data are determined based on the characterization data received, in view of identifying each device, to obtain the associated readout key and interpret the second data according to the readout key obtained. Relying on a single characterization step (from which both types of data are obtained) may be advantageous in some applications, as it may simplify operations performed locally, e.g., at the point of care.

Preferably, the physical fingerprint is an unclonable property of the one or more arrays of each device. Unclonable properties, such as physical unclonable properties, make it more difficult (or even impossible in practice) for malicious users to replicate optical devices of the arrays. In variants, one may rely on embedded security features instead of unclonable properties. Further variants may exploit unclonable properties of or security features embedded in physical anchors affixed to the optical devices.

In some embodiments, the optical devices of the set comprise, each, two or more arrays of metasurface structures, which together confer the distinct properties to the optical devices, for the devices of the set to differ from each other. The properties can accordingly more easily be tailored, to lead to different (but predictable) properties, and thus to different characterization outcomes upon performing the optical characterization examinations. Appropriate readout keys can nevertheless be assigned to the optical device, where such keys encompass a code, a function, etc., according to which the outcomes of the examinations can be rightfully interpreted.

Preferably, the metasurface structures of at least one of the arrays of each device are coated with substances for selectively binding analytes, wherein the substances form respective functionalization patterns for the arrays of the devices. The outcome of the characterization examination, as captured by the second data is (for each device) impacted by both the metasurface structures of the respective arrays (of each device) and a respective one of the functionalization patterns. The latter may possibly give rise to distinct optical signals, all forming part of the outcome (for each device). So, the readout key also accounts for the respective one of the functionalization patterns in that case.

Preferably, the substances comprise molecular receptors for selectively binding the analytes. The metasurface structures of at least one of the arrays of each device are coated with the molecular receptors, for the arrays of the devices to be functionalized according to respective functionalization patterns formed by the molecular receptors.

For example, two or more of the arrays of each device may be coated with distinct types of molecular receptors for selectively binding distinct types of analytes. The receptors may for instance be formed as molecular compounds immobilized on a surface of the one or more metasurface structures. The molecular compounds may comprise, each, several moieties, including a first moiety anchored to the surface, and a second moiety, which is a receptor chemically connected via a backbone to the first anchoring moiety. The several moieties may advantageously comprise a third moiety that is a protection moiety for acetylene, where the protection moiety is bonded to an acetylene unit of the backbone via an electrochemically breakable bond. In that case, the method may further comprise deprotecting acetylene units of backbones of the molecular compounds by electrochemically cleaving the protection moieties, prior to binding the molecular receptors to the deprotected acetylene units. As the initially protected acetylene unit is immobilized on the surface, the deprotection mechanism leads to an acetylene-functionalized surface. As such, it provides a chemically flexible attachment, which makes it possible to subsequently bind a large variety of functional receptors to the cleaved compounds. Together with the electrochemical addressable deprotection, a site-selective functionalization can be performed to create metasurfaces devices with different (patterns of) substances.

In some embodiments, the outcome of the optical characterization examination comprises optical data representing a spectral response of each device, e.g., spectral responses of each of the arrays of each device. Preferably, the method further comprises, for each device and prior to accessing first data and second data, performing the optical characterization examination by illuminating each array of each device with electromagnetic radiation, at a frequency that matches a resonance frequency of the metasurface structures of the array in absence of analytes. The spectral response may for example be a response to electromagnetic radiation transmitted through each device, whereby the spectral response reflects changes of absorption resonance caused by an effective change in a dielectric environment of the metasurface structures in one or more of the arrays of the device.

In some embodiments, the method is performed (at least partly) at a server, which is in data communication with a set of client devices. In such cases, the method may further comprise, for each device and prior to accessing the first data and second data, receiving data from one of the client devices that is paired with each optical device, whereby the first data and the second data can be accessed by the server based on the data received, for the server to identify each device based on the first data accessed and interpret the second data according to the readout key accordingly obtained. In variants, the interpretation is performed on the client side.

The method may further comprise, after having identified each device and interpreted the second data to elucidate the outcome of the optical characterization examination, sending a message to the one of the client device, the message including information as to the elucidated outcome. In variants, this message may include information that is used to interpret the optical data, thereby enabling a result to be generated by the client device itself.

In some embodiments, the method further comprises, for each device of the set, and prior to accessing the first data and the second data for any of the devices of the set: fabricating each device, for the one or more arrays of each device to have a respective one of the distinct properties; and associating the readout key for the respective one of the distinct properties with an identifier of each device.

In some embodiments, the method further comprises, after fabricating each device and prior to accessing the first data and the second data for any of the devices of the set, reading out the physical fingerprint of each device to obtain a digital fingerprint corresponding to the physical fingerprint, and associating the digital fingerprint with the identifier of each device.

In some embodiments, each array of each of the devices comprises a pattern of repeating cells of metasurface structures, where each cell comprises at least one (e.g., two) metasurface structure(s), each. The metasurface structures are preferably formed as semiconductor layer structures arranged on top of a substrate. The substrate may for instance be transparent to allow optical characterization examinations in transmission. The semiconductor structures may possibly have, each, a lateral dimension that is between 1 nm and 500 nm, on average, the lateral dimension being measured parallel to a main surface of the substrate. Preferably, the semiconductor structures have, each, a vertical dimension that is between 10 nm and 500 nm, on average, and a standard deviation of the vertical dimension is less than 5 nm, the vertical dimension being measured perpendicular to the main surface of the substrate.

According to another aspect, disclosed herein is a computer program product for interpreting optical characterization examinations performed with a set of devices such as described above. That is, each device comprises one or more arrays of electromagnetic metasurface structures and the devices are tailored, such that their respective arrays have distinct properties. The computer program product comprises a computer readable storage medium having program instructions embodied therewith, wherein the program instructions executable by processing means to cause the latter to implement steps according to the present methods, for each device of the set. Namely, such program instructions cause to access first data and second data, identify each device based on the first data accessed, to obtain a readout key, and interpret the second data according to the readout key to elucidate the outcome of the optical characterization examination, as explained above.

Methods and computer program products will now be described, by way of non-limiting examples, and in reference to the accompanying drawings.

BRIEF DESCRIPTION OF SEVERAL VIEWS OF THE DRAWINGS

The accompanying figures, where like reference numerals refer to identical or functionally similar elements throughout the separate views, and which together with the detailed description below are incorporated in and form part of the present specification, serve to further illustrate various embodiments and to explain various principles and advantages all in accordance with the present disclosure, in which.

Figure 1:
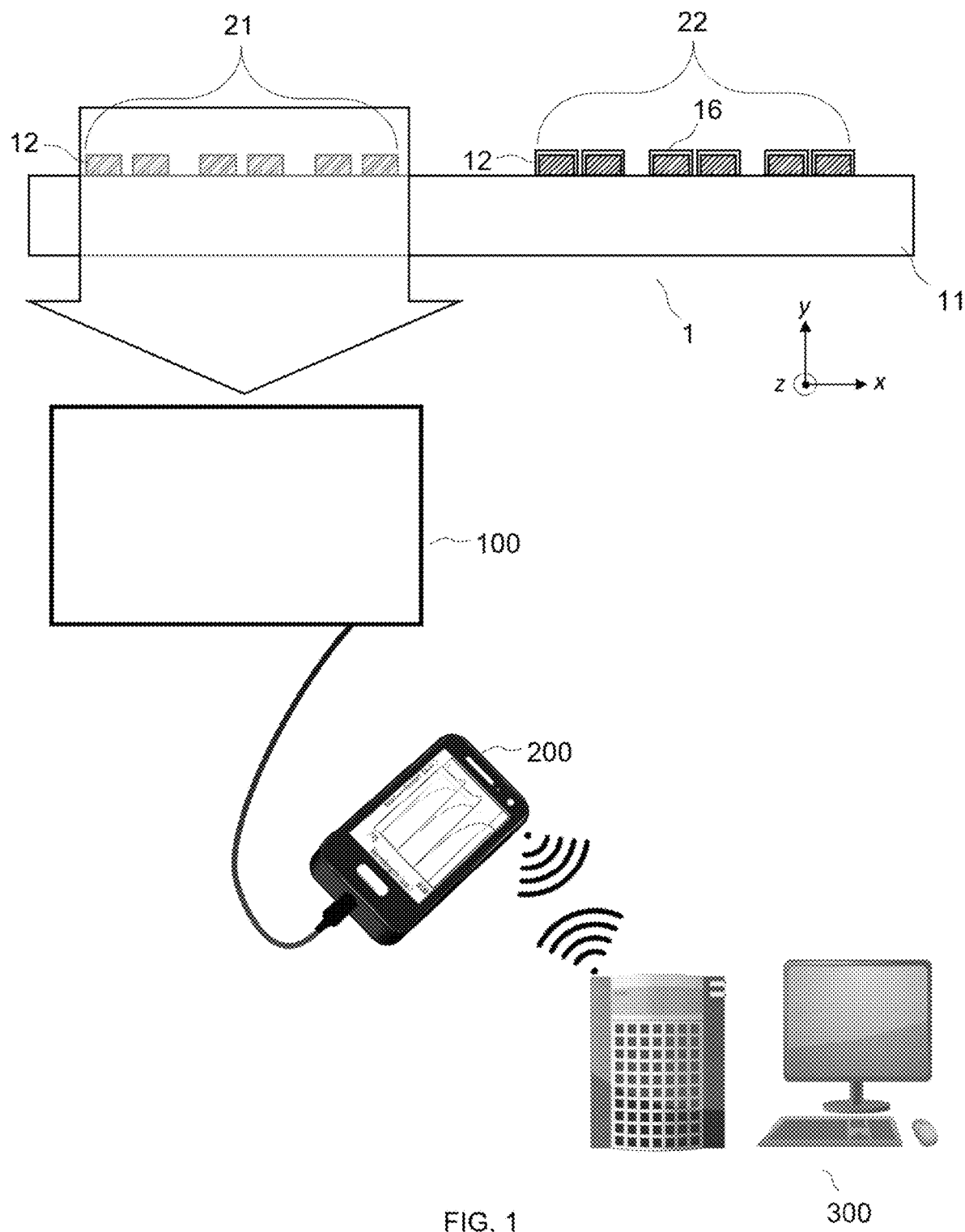
FIG. 1 is a block diagram schematically illustrating components of a system involving an optical device having arrays of functionalized metasurface structures, an optical detector, a smartphone connected to the detector, and a server connected to the smartphone, to interpret an optical characterization examination performed with the optical device, as in some embodiments. In variants, the mobile phone is used as optical detector, whereby use is made of the integrated camera of the smartphone.

The accompanying drawings show simplified representations of devices or parts thereof, as involved in some embodiments. Technical features depicted in the drawings are not necessarily to scale. Similar or functionally similar elements in the figures have been allocated the same numeral references, unless otherwise indicated.

DETAILED DESCRIPTION

Assuring the authenticity of products is a need across multiple industries, particularly where there is a risk of causing harm or other adverse consequences, should, e.g., fake or already used products be utilized. While tracking and tracing the logical and physical route, conditions, and chain of custody (or ownership) of goods throughout the entire supply chain and the life-cycle of the assets are essential, it is furthermore desirable to maintain a tight link between physical objects and their digital representation. A blockchain (or any other digital track-and-trace solution) is most often insufficient to prove authenticity, correctness, and/or rightfulness, e.g., an uninterrupted chain of custody, in supply chains or throughout the product lifecycle. In general, such attributes can only be ascertained when trust can be extended to the physical domain. The physical object must accordingly be tied to the associated digital record.

Typically, an object is associated to a digital record by a unique identifier (UID) that represents either the individual object or a class of objects by model, batch, production site, manufacturer or the like. The UID is typically printed, embossed, or attached as a tag to the object or its packaging. Most UIDs can easily be copied and, e.g., assigned to an illegitimate clone of the object. Hence, an identifier alone cannot uniquely and securely identify (i.e., and thereby authenticate) an object.

The concept of crypto-anchor was introduced to solve this problem. Crypto-anchors exploit a range of properties of physical objects to securely associate such objects to UIDs. These properties encompass physical fingerprints (e.g., uncontrollable aspects, such as fabrication inaccuracies and variations in the composition of materials), embedded security features (e.g., tunable, inherent material properties, and material functionalizations), and configured secrets (e.g., based on cryptographic keys).

Besides, optical metasurface structures are an emerging class of flat-optical elements, which have applications in various areas due to their high sensitivity towards changes in their local dielectric environment. Metasurface structures may, for example, be made of metals or dielectric materials. Such elements allow light to be manipulated in a very efficient way, below the diffraction limit. Applications include electro-magnetic field enhancement, polarization change, spatial light-bending, spectral filtering, narrow-band absorption, etc. Metasurfaces tailored to operate in the visible and near-infrared regime of the electromagnetic spectrum have nanometer-sized dimensions, typically ranging between a few 10s to 100s of nanometers, or even smaller. The operation of such structures mostly rely on resonance conditions with incident light of specific wavelength.

For example, absorption resonance shifts can be measured. Such changes can be employed for compound-selective sensing, e.g., by functionalizing the metasurfaces with molecular receptor compounds that allow selective binding of analytes, thereby allowing the required dielectric changes. Because of spectrally narrow properties, e.g., absorption dips, the response of the device can not only be read-out with laboratory instrumentation (using, e.g., spectrometer or laser-based systems) but also with benchtop devices using a single, spectrally narrow, light source combined with, e.g., a small CMOS imager. One may for instance desire to implement such technology on IoT devices or mobile phones connected to cloud applications, which could therefore become available to individuals for mobile or home usage. Scenarios that involve distributed devices or mobile phones, however, also make it more difficult to track the authenticity of products and thus call for additional security measures.

The following description is structured as follows. First, general embodiments and high-level variants are described (section 1). The next section (section 2) addresses specific embodiments (section 2.1), preferred fabrication methods (section 2.2), and technical implementation details concerning the computer program products (section 2.3) and computerized devices (section 2.4) as used in some embodiments.

The present method and its variants are collectively referred to as "the present methods". All references "S$u$" refer to methods steps of the flowchart of FIGS. 5 and 6, while numeral references pertain to devices, physical parts, or components, as involved in some embodiments.

1. GENERAL EMBODIMENTS AND HIGH-LEVEL VARIANTS

In reference to FIGS. 1, 2, 5, and 6, an aspect is first described that concerns a method of interpreting optical characterization examinations performed with a set of optical devices 1, 1$a$-1$c$.

Each device comprises one or more arrays 21-26 of optical metasurface structures 12, also referred to as electromagnetic metasurface structures in literature. Such structures 12 are sometimes referred to as "metasurfaces" in the following. In the present context, such metasurface structures can be made from a dielectric material, a semiconductor material, such as silicon, or a metal. Preferred is to use a semiconductor, e.g., silicon; the metasurface structures are preferably fabricated using an indirect transfer process such as described in section 2.2, which results in accurate and clean metasurface structures. As known per se, such metasurface structures are arranged according to a given in-plane pattern. An optical device may include a single array of metasurface structures, in applications. However, each optical device may include several arrays of metasurfaces, as in some embodiments described below in reference to FIGS. 2-4. The present optical devices 1, 1$a$-1$c$ are preferably fabricated as sensing devices, as described in detail in section 2.1.

The optical devices 1, 1$a$-1$c$ of the set are tailored; their respective arrays 21-26 have distinct properties. Various types of properties of the arrays may be exploited to differentiate the devices, as discussed later in detail.

The present methods involve a series of steps, which are performed for each optical device of the set. In the following, such steps are often described in respect to a given device 1. However, similar steps will be performed for each device of the set, normally in an independent and therefore asynchronous manner.

To start with, first data and second data need be accessed S31, S31a (FIG. 5), e.g., by a server 300 (FIG. 1). The first data captures a physical fingerprint of the given device 1, while the second data reflects an outcome of an optical characterization examination performed S25 (FIG. 5) with the device 1. This outcome is impacted by the specific properties of the array(s) of the device 1. In the present context, an optical characterization examination refers to an examination involving electromagnetic waves (not necessarily limited to the visible spectrum) and electromagnetic-matter interactions.

The optical devices of the set have distinct arrays or set of arrays, which exhibit distinct properties so that the devices differ. Moreover, each optical device may possibly include several arrays with distinct properties. That is, not only do the optical devices differ from each other (because of their respective arrays) but, in addition, the arrays of a same device may differ. In that case, an optical characterization examination performed with a given optical device may give rise to distinct optical signals (owing to the distinct arrays), which may possibly be combined (when irradiating all the arrays concomitantly) or be obtained one after the other (when successively irradiating the arrays, one at a time). All such distinct signals accordingly impact or somehow form part of the outcome of this examination. Such signals are captured by or somehow impact the second data for examinations performed with each optical device of the set.

The first and second data are exploited as follows, for each device of the set. First, referring to FIG. 5, a given device 1 is identified S32 based on the first data accessed, to obtain S33 a readout key associated S17 with the identified device. This assumes that the readout key has been devised to account S15 for the specific properties of the given device 1. More generally, the readout keys associated to the optical devices 1, 1a-1c account for the respective, distinct properties of these optical devices, as explained later in detail.

Finally, the second data accessed in respect of said given device 1 can be interpreted S35 according to the readout key obtained, to elucidate the outcome of the optical characterization examination performed with this device 1. More generally, the same steps are performed for each device of the set, to elucidate outcomes of optical characterization examinations performed therewith, due to respective readout keys. These outcomes may then be provided to an examining device associated with an entity performing the examination. For example, the device may be a diagnostic computer associated with an examiner or the like, or it may be an automated device that receives control instructions from another source.

Some of the concepts introduced above are now explained in detail. To start with, a physical fingerprint captures a unique physical property of a device, which typically is a non-controllable or non-deterministic property of the device (e.g., a physical unclonable property), resulting from deviation or inaccuracies in the fabrication process. In the present context, such a physical fingerprint may, for example, result from fabrication or composition inaccuracies. The physical fingerprint of a particular optical device 1 is here exploited to identify and/or authenticate this particular device 1. This may possibly require performing an initial characterization of the device to read out the associated physical fingerprint, prior to performing said optical characterization examination, as assumed in the flowchart of FIG. 5.

Figure 3A:
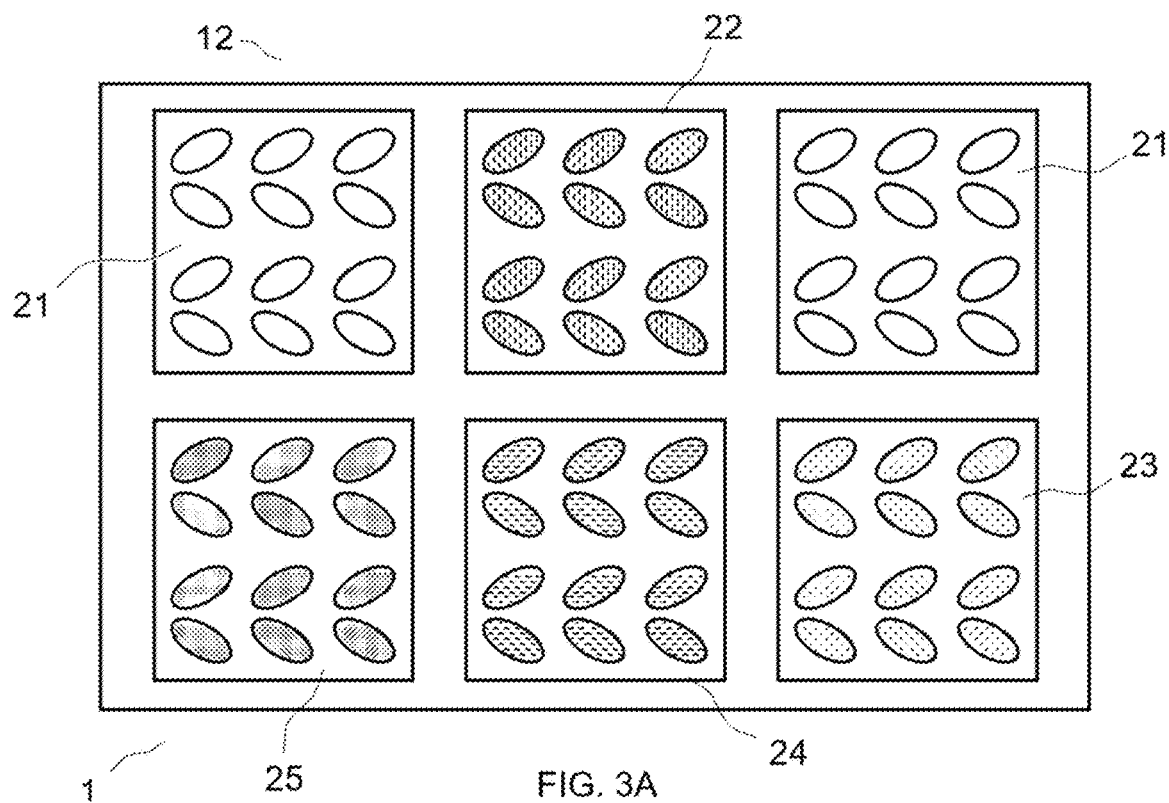
FIGS. 3A and 3B are schematic top views of optical devices having distinct array properties (denoted by distinct pattern fills), as in some embodiments.
Figure 3B:
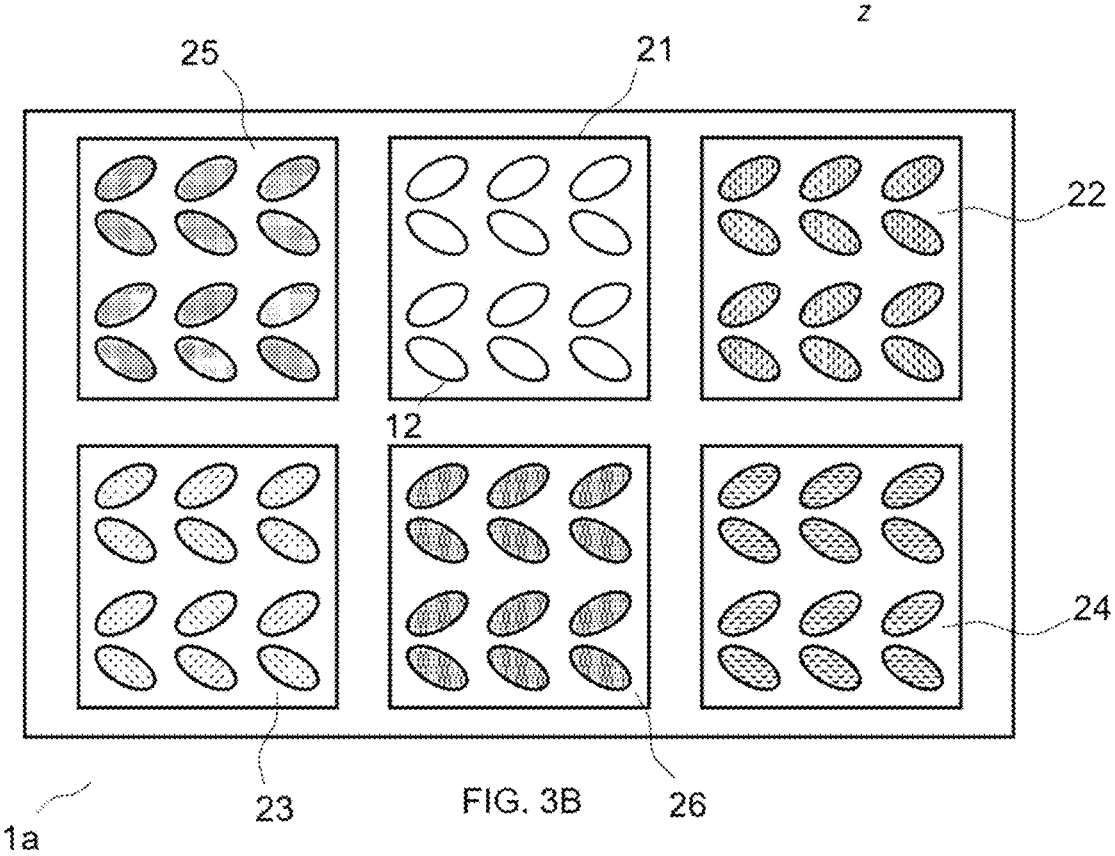
Figure 4:
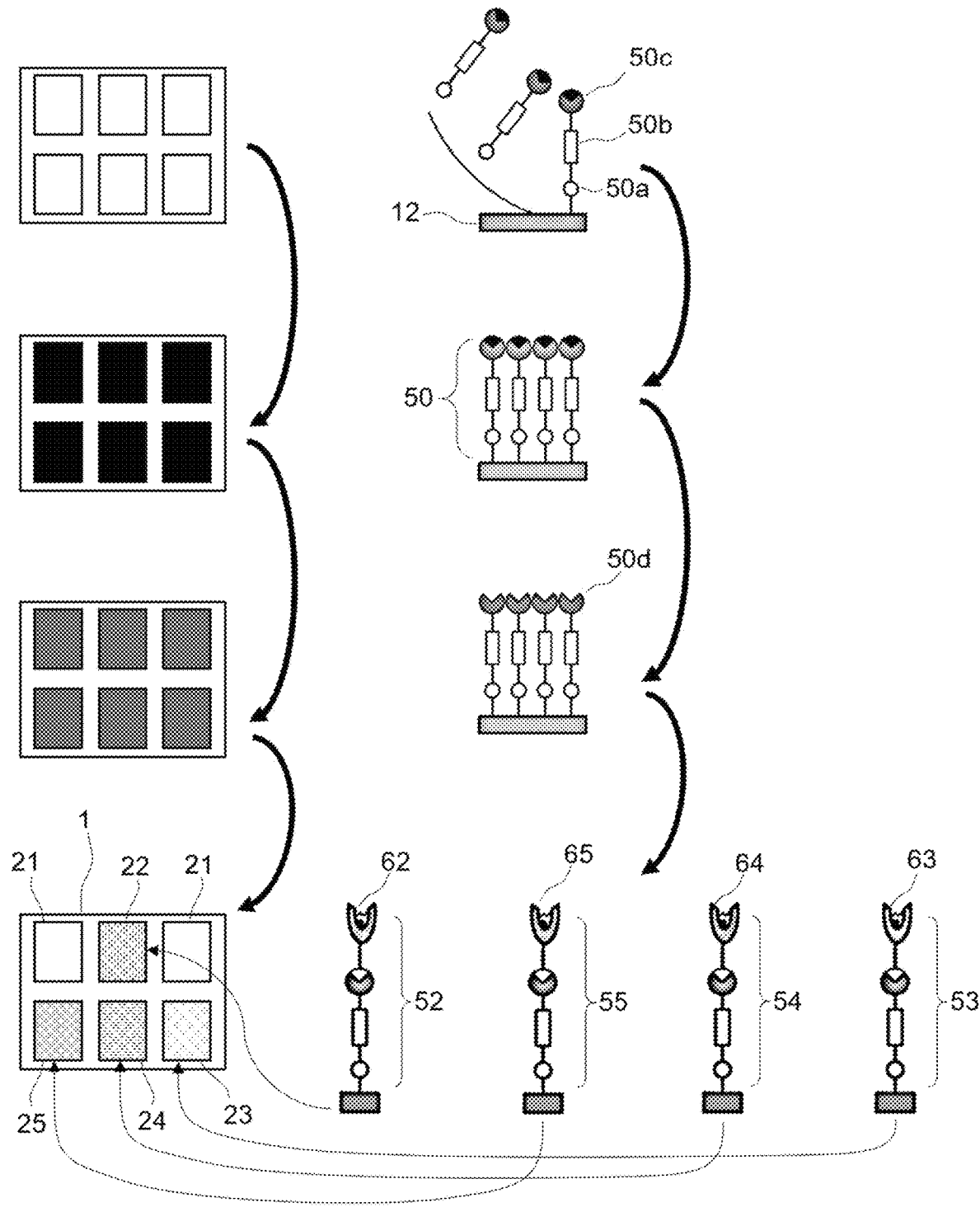
FIG. 4 is a sequence diagram illustrating how metasurface structures of the arrays of an optical device can be coated with molecular receptors for selectively binding analytes to form a given functionalization pattern for the arrays of this optical device, according to embodiments.

The outcome of the optical characterization examination is impacted by a deterministic property of the respective array(s) 21-26 of each device 1, as opposed to the physical fingerprint, which typically captures a non-deterministic property of the device 1. Each optical device may for example include metasurface structures 12 having distinct types of molecular receptors (see FIGS. 3 and 4) or other chemical substances. Some metasurface structures may have receptors, while others may not (as seen in FIGS. 3 and 4). Furthermore, some of the metasurfaces structure arrays may possibly be coated with identical types of receptors (or may have no receptor at all), etc. Thus, the devices 1, 1a-1c may exhibit distinct functionalization patterns. The latter may for instance be obtained by, e.g., randomly varying the types of functionalization across the arrays for each optical device.

The purpose of the optical characterization examinations performed is, eventually, to sense a particular analyte. For example, the selective binding properties of the functionalized metasurfaces structures can be exploited to sense this analyte. However, the distinct properties of the arrays of the optical devices (e.g., the functionalization patterns) further act as embedded security features. In variants to functionalization patterns, other, well-controllable properties of the arrays may be exploited to achieve the required security features, such as the geometries of the metasurfaces, leading to geometry-dependent optical properties and, thus, geometry-dependent optical signals. The geometry of the metasurfaces here typically refers to the in-plane shape and dimensions of the metasurfaces (e.g., an ellipse, as assumed in FIGS. 2 and 3) and/or the distance between two metasurface structures (in each pair), although the role played by intra-pair distances is typically less important than that of the in-plane shape and dimensions of the metasurfaces. In another example, both the receptor functionalization and the geometry variations are exploited.

In all cases, because the arrays of the various optical devices have distinct, pre-configured properties, such properties can play the role of configured secrets. The outcome of the optical characterization examination is thus "encrypted" (or somehow obfuscated), by virtue of this configured secret, since the devices differ and thus have distinct configured secrets. This is advantageous over a solution that would solely exploit variations in the receptors and their geometry, as such variations may possibly be detected or reverse-engineered (e.g., using optical means, electron microscopy, chemical characterization, or even with a trained eye).

Figure 2:
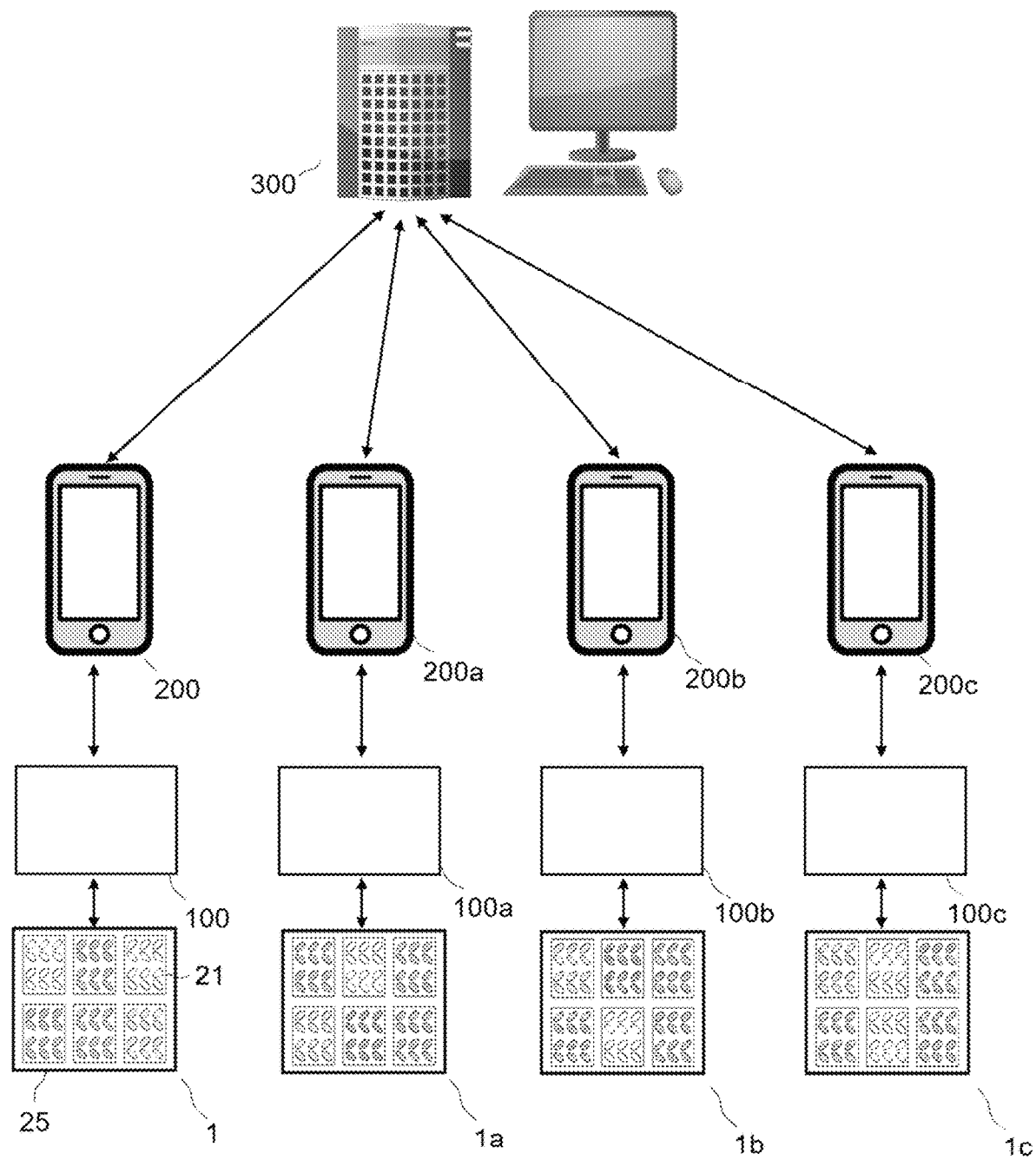
FIG. 2 is another block diagram schematically illustrating a server interacting with several optical devices (having distinct array properties) via respectively connected smartphones to interpret optical characterization examinations performed with the optical devices, as in some embodiments.

As noted earlier, two types of data are accessed and exploited. The first data are used to identify S32 a particular device, e.g., in order to obtain an identifier for this device, and then identify S33 a readout key associated with this identifier, though the readout key may also play the role of identifier. The readout key obtained is then used to elucidate the outcome of the characterization examination. That is, the readout key compensates for specificities of each optical device, to enable a correct interpretation of the second data. Such steps may for instance be performed (at least partly) at a server 300 communicating with client devices 200, 20a-200c (e.g., smartphones), which are themselves in data communication with optical detectors 100, 100a-100c (e.g., CMOS imagers, CCDs). The latter are used to read out optical signals obtained through the optical characterization examinations performed with the optical devices 1, 1a-1c, as illustrated in FIGS. 1 and 2. As the present methods require interactions with client devices 200, 20a-200c, some of the steps may partly or jointly be performed at the client devices, using, e.g., a secure, dedicated application executing thereon. Even, some of these steps may predominantly be performed at the client devices 200, 20a-200c.

The tests performed with the different optical devices 1, 1a-1c lead to different readout signals and, thus, different outcomes. A given outcome is impacted by the unique properties of the arrays 21-26 of each optical device. This outcome may notably be impacted by electromagnetic interactions or other physical interactions occurring between sets of two or more of interacting elements, where the latter notably include the metasurface structures 12, the functionalization layers (if any), and the dielectric environment such as solvents or other media.

Each readout key accounts for a respective, unique property of each device. Thus, obtaining the readout key allows the encrypted optical signal to be suitably interpreted/decrypted. The readout keys are normally unknown to the users performing the optical characterization.

The present approach allows two levels of security. First, the physical fingerprint is difficult, if not impossible, to clone, such that each device 1, 1a-1c can be unambiguously identified. Second, readout keys can only be obtained for those devices that have been duly identified. Users too may possibly be authenticated in the process. Thus, only the legitimate devices (and possibly authenticated users) may cause the server and/or the client devices to suitably interpret results obtained with the tailored optical devices.

All this is now described in detail, in reference to particular embodiments of the invention. To start with, two cases or classes of embodiments can be distinguished. In a first case, see FIG. 5, the first and second data are read out due to distinct characterization (or detection) steps S24, S25. That is, a preliminary optical readout is performed S22, S24, prior to exposing S25 the device to one or more analytes and performing the second readout to obtain the second data. Typically, this preliminary optical readout is efficiently performed and processed (in less than 100 ms time). In the second case, see FIG. 6, a single characterization step S25a suffices. In both cases, the required characterization step(s) can be performed at the point of care, home care, mobile care or according to any other suitable application setting.

Figure 6:
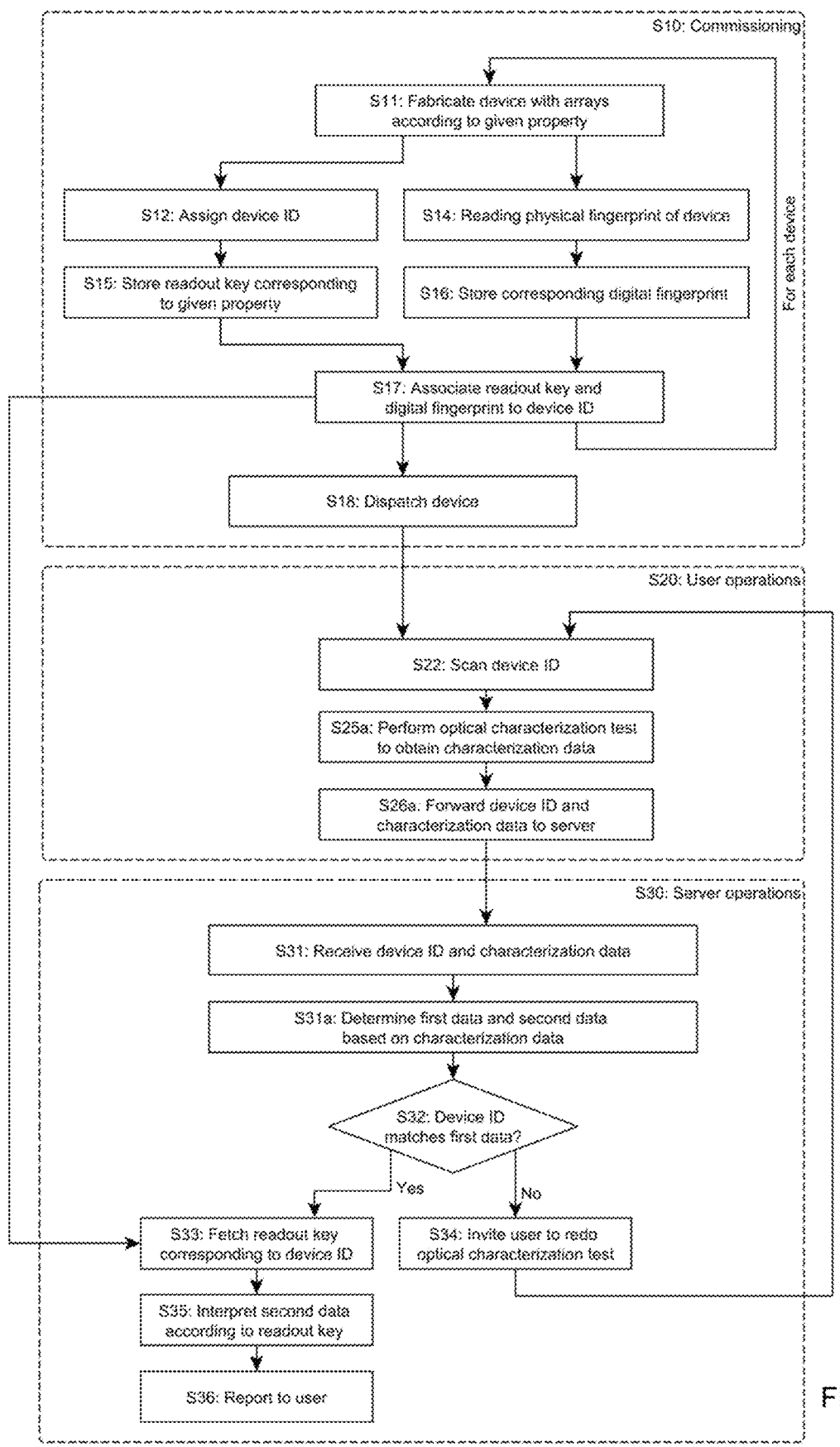
FIG. 6 is a flowchart similar to that of FIG. 5, except that a single characterization step is needed, yielding characterization data, from which the first and second data are extracted, as in some embodiments.

In the second class of embodiments, FIG. 6, a one-shot read-out is performed, whereby the first and second data are acquired in a single characterization examination (per device). The outcome of the characterization examination is impacted by both the respective array properties and the physical fingerprint of each device. In that case, the readout keys may account S15 for both the distinct array properties and the physical fingerprints of each of the optical devices 1, 1a-1c. The first and second data may be accessed as follows. First, characterization data corresponding to a characterization examination performed with a given optical device are received S31 and then the first and second data are determined S31a based on the characterization data received, in view of identifying S32 said given device 1, to obtain S33 the associated readout key. The second data is eventually interpreted S35 according to the readout key obtained, as shown in FIG. 6.

Figure 5:
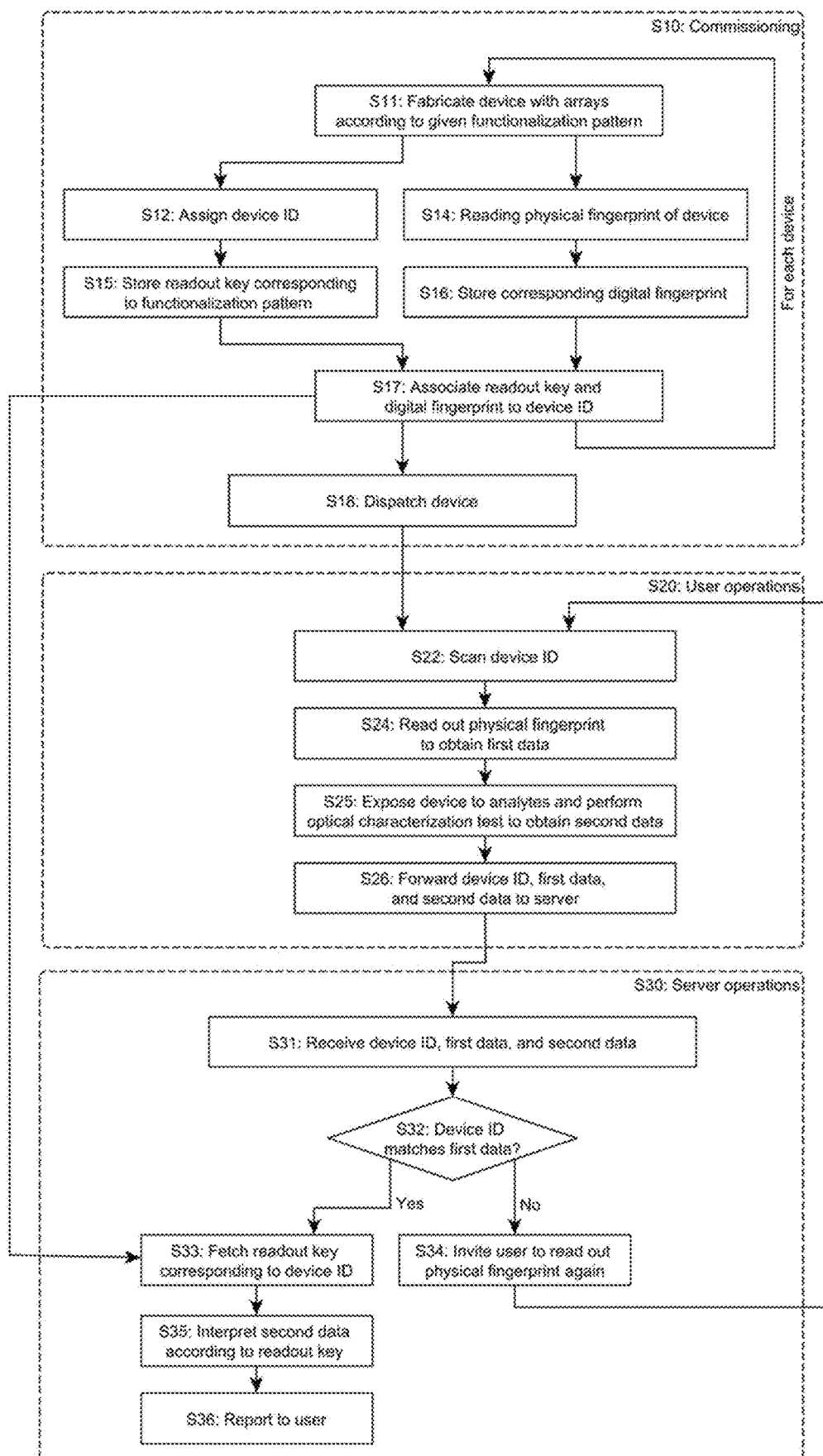
FIG. 5 is a flowchart illustrating high-level steps of a method of interpreting optical characterization examinations performed with a set of optical devices, where first and second data are obtained due to respective characterization (or detection) steps. Each device is identified based on first data, to obtain an associated readout key, which is then used to interpret the second data, as in some embodiments.

FIGS. 5 and 6 assume that steps S31, S31a, S33, and S34 are performed at the server. In variants, however, such steps may be performed at the client device, whereas the server may only be used to confirm S32 the device ID and return the readout key in response to a query S33 from the client device.

A single characterization step may for instance be sufficient when the physical fingerprint forms part of (or is somehow embodied, or formed, by) the metasurface arrays or another part of the optical device that happens to detectably impact the characterization examination—in that respect, that the first and second data may possibly correspond to distinct properties of a single signal. In variants, one of these properties may possibly be derived from the other (e.g., the first data may be a derivative of the second data). In all cases, the first data makes it possible to identify S32 each device 1 to obtain S33 the associated readout key, and then interpret S35 the second data according to the readout key obtained.

Relying on a single characterization step (from which both types of data are obtained) may be advantageous in some applications, as it simplifies the operations performed locally, e.g., at the point of care. However, such embodiments may add complexity in the data extraction. Whether the benefits of this approach outweigh the disadvantages must also be appreciated in view of the fact that preliminary optical read-out (prior to analyte exposure) required in the first class of embodiments (FIG. 5) is normally simple to perform and not time intensive. The preliminary optical read-out can, for instance be performed upon starting the device to ensure proper positioning of the optical devices when embodied in disposable cartridges.

The physical fingerprint is preferably an unclonable property of the array(s) 21-26 of each optical device 1. Such a property is sometimes referred to as a physical unclonable property. This unclonable property may have a physical and/or chemical origin. This physical and/or chemical property may, for instance, result from (e.g., uncontrolled or unintended) small dimensional variations in the metasurface structures 12, be it in their geometry or morphology, chemical composition, and/or chemical functionalizations. Unclonable properties make it more difficult (in fact impossible in practice) for malicious users to replicate the optical devices.

In variants to inherent physical fingerprints of the optical device arrays, one may furthermore rely on an unclonable property of another part (i.e., distinct from the array) of the optical device or, even, on physical anchors that are purposely provided and affixed to or integrated in the optical devices. The physical anchor may for example be unalterably affixed to (entangled with) the optical device, e.g., with a strong adhesive or in a way that irrevocably alters the optical device or a main functionality thereof, when removed, destroyed, or otherwise altered. The anchor may also be integrated, in an inalterable way, in a body of the optical device.

Just like the inherent physical fingerprints discussed earlier, a physical anchor may, for example, include embedded security features (e.g., micro-printing, security ink, fluorescent dyes, or hologram), and/or an unclonable function. Such a physical anchor is much preferably affixed to the optical device itself, rather than its packaging, as the trust-anchor is established for the object bearing the physical anchor. That is, the best protection is achieved for the actual object whose unique physical property is exploited.

Physical anchors normally make it easier to achieve unique physical properties for the optical devices, and this in a more systematic and controllable way. Still, inherent physical fingerprints will normally provide a larger degree of entropy, which make them more difficult to clone. In contrast, physical anchors provided on purpose are, in principle, easier to attack precisely because they are more controllable and systematic. Thus, the uniqueness of explicit physical anchors must be generated with some effort. In variants relying on purposely added anchors, the unclonable property can be characterized independently from the arrays, as assumed in FIG. 5.

Still, in each of the two cases mentioned above (whether based on inherent fingerprints or added physical anchor), the exploited physical property preferably reflects an uncontrollable (or not fully controllable) fabrication feature, i.e., a non-deterministic property, that is subject to some non-deterministic variations but is nevertheless detectable, such that this property is unclonable.

In other variants, instead of exploiting unclonable properties of the arrays or the purposely added physical anchors, one may rely on embedded security features (e.g., microprinting, security ink, or hologram). Such features normally are deterministic features but are nevertheless difficult to clone.

Referring now to FIGS. 2-4, the optical devices 1, 1a-1c preferably comprise, each, two or more arrays 21-26 of metasurface structures 12, which confer the distinct properties to the optical devices 1, 1a-1c. The latter accordingly differ from each other. The distinct properties may for instance result from controlled (i.e., intended) dimensional and/or compositional variations in the metasurface structures, and/or in their coatings, as discussed below in detail.

Advantageously, the metasurface structures may be fabricated with a 1-nm accuracy, due to preferred fabrication methods as disclosed herein (see section 2.2). The properties accordingly obtained for the arrays can be said to be deterministic in the sense that they lead to different but predictable properties. Thus, they lead to different characterization outcomes upon performing the optical characterization examinations. Accordingly, appropriate readout keys can be deterministically assigned to the optical devices, where such keys encompass a code, according to which the outcomes of the characterization examinations can be correctly interpreted (i.e., unscrambled).

As noted earlier, however, the arrays may also be impacted by non-deterministic properties. In that case, the arrays have properties that are partly (in fact essentially) deterministic and partly non-deterministic. Yet, the readout key may be devised to account for both types of properties.

In some embodiments, the metasurface structures 12 of at least one of the arrays 21-26 of each of the optical devices are coated S11 with substances for selectively binding analytes, see FIG. 4. The substances form respective functionalization patterns for the arrays 21-26 of the optical devices 1, 1a-1c. In that case, the outcome captured by the second data is, for each optical device 1, impacted by both the metasurface structures 12 of the respective arrays 21-26 and a respective one of the functionalization patterns. Consistently, the readout keys must account S15 for the respective functionalization patterns. That is, the optical devices 1, 1a-1c have distinct functionalization patterns, resulting in distinct deterministic properties, which act as configured secrets. In variants, or in addition to the patterns, other well-controllable properties of the arrays 21-26 may be exploited, such as the geometry of the metasurface structures 12, as noted earlier.

The substances can for example be chemical receptors or other substances (e.g., particles) for binding analytes. However, the use of particles may not be desired as particles may add additional variations that cannot easily be controlled, which may compete with non-deterministic aspects as otherwise provided for. Thus, the substances preferably comprise molecular receptors 52-55, which are adapted for selectively binding analytes of interest. That is, for each optical device of the set, the metasurface structures 12 of at least one of the corresponding arrays 21-26 may be coated S11 with molecular receptors 52-55. This way, the arrays of the optical devices 1, 1a-1c can be functionalized according to functionalization patterns formed by the molecular receptors 52-55. The arrays 21-26 of each optical device may possibly be coated S11 with distinct types of molecular receptors 52-55, to be able to selectively bind distinct types of analytes.

The molecular receptors are advantageously formed as molecular compounds 52-55 immobilized on the surface of the metasurface structures 12, as illustrated in FIG. 4. The molecular compounds 52-55 comprise, each, several moieties, including a first moiety 50a anchored to the top surface of the metasurface structures 12, and a second moiety 62-65, which is a molecular receptor having high binding affinity towards certain analytes. The receptors 62-65 are chemically connected 50d, via a backbone 50b, to the first anchoring moiety 50a.

As further seen in FIG. 4, the moieties may further comprise a third moiety 50c. The latter may, for instance, be a protection moiety for acetylene, e.g., comprising a redox-active naphtoquinone chromophore. The protection moiety 50c is bonded to an acetylene unit of the backbone 50b via an electrochemically breakable bond. It is therefore necessary to deprotect S11, the acetylene units of the anchored molecular compounds, e.g., by electrochemically cleaving the protection moiety prior to binding the molecular receptors to the liberated acetylene units, as illustrated in FIG. 4. The molecular compounds accordingly obtained can then be exposed S25 to analytes to perform the optical characterization examinations.

The deprotection mechanism can, for instance, be based on an electrochemical reduction of the protection moiety. A single-electron reduction mechanism, an oxidation mechanism, or a facilitated two-electron mechanism is preferred, inasmuch as such mechanisms are more efficient and require less electrochemical energy. As the initially protected acetylene unit is immobilized on the surface via a backbone and an anchoring moiety, the deprotection mechanism leads to an acetylene functionalized surface. As such, it provides a chemically flexible attachment, which makes it possible to subsequently bind a large variety of functional receptors to the cleaved compounds, namely by chemically binding to the liberated acetyl.

For example, the metasurface elements 12 may be formed as semiconductor structures 12, e.g., silicon, coated with molecular receptors formed as molecular compounds immobilized on the top surface of the metasurface structures 12, as explained above. In variants, one may functionalize the structures 12 with antibodies, viruses, or other kind of particles for sensing applications, which can all be immobilized either directly (in a physisorbed manner) or via chemical compounds to achieve a physisorbed functionalization layer. Also, the binding moiety 50d may consist of antibodies, RNA, DNA, etc., aiming at selectively capturing various types of analytes via chemical binding interactions. As said, not all metasurface structures 12 of each optical device need necessarily be functionalized. Aside from chemical functionalization, the metasurface structures can also have metasurfaces-intrinsic properties, e.g., for light manipulation purposes.

Preferred optical characterization examinations are now described in detail. As illustrated in FIG. 1, the optical characterization examinations S25, S25a performed involve electromagnetic interactions, whereby the arrays of the devices 1, 1a-1c are illuminated (i.e., irradiated) S25 with electromagnetic radiation, which, in turn, gives rise to a spectral response of the optical devices. Accordingly, the outcome of an optical characterization examination S25, S25a may comprise optical data representing a spectral response of each optical device. The second data (and possibly the first data too) are subsequently extracted from the optical data.

In some embodiments, each array of each optical device 1 is illuminated with electromagnetic radiation (e.g., using a spectrally narrow light source) at a frequency that matches a resonance frequency of the metasurface structures 12 of the array in absence of analytes. The narrow light source is centered at a specific frequency that matches the resonance frequency of the empty receptor-metasurface layer. This procedure aims at exploiting intrinsic, built-in spectroscopic properties of dielectric metasurfaces where, e.g., very narrow absorption resonances are used. This allows the spectrometer to be replaced (and optical signals to be read-out) when using a single narrow light pulse or a combination of multiple, spectrally different narrow light pulses and a CMOS imager.

A transmission set-up is preferred, as assumed in FIG. 1. In that case, the spectral response of each optical device 1 is a response to electromagnetic radiation transmitted through the optical device 1. In variants, reflection setups may be used. In both cases, the spectral response of the device 1 reflects changes of absorption caused by the effective change in the dielectric environment of the metasurface structures 12 in one or more of the arrays 21-26 of the optical device 1. It may be desirable to observe absorption resonance shifts upon selectively capturing analytes on specific metasurface structures 12 of one or more of the arrays 21-26 of the optical device 1, either on absorption or transmission, whereby the analytes chemically bind to the metasurfaces structures 12 due to specific analyte-binding molecular receptors. The optical resonances of the metasurface structures change upon binding the analytes. This allows label-free sensing measurements to be performed without using radioisotopes, fluorescent dyes, etc., as the presence of the analyte directly affects the optical properties of the metasurface 12. Such an approach allows higher sensitivity and higher spatial resolution compared to, e.g., approaches based on localized surface plasmon resonances.

In some embodiments, the arrays are sequentially irradiated (one array at a time). Eventually, the outcome of the optical characterization examination may include several results, aggregating results obtained for each array. In variants, all arrays can be read simultaneously, e.g., using a 2D CCD detector (with spatial resolution), which further allows energies to be discriminated. In other variants, multiple optical examinations are performed for each array, e.g., to capture different analyte-receptor binding dynamics and to generate transient signals upon the analytes binding to the receptors. This allows a data analysis that accounts for the binding dynamics as a discriminating feature.

Several types of optical metasurface structures 12 can possibly be contemplated on a same chip, such as dielectric metasurfaces, surface plasmon resonance (SPR) metasurfaces using gratings or nanohole arrays, for example, localized SPR metasurfaces (e.g., using nanohole arrays, nanoantennas, or nanostructures arranged on a substrate). Hence, several types of optical characterization examinations can be contemplated on the same chip (be it in reflection or transmission if the substrate is transparent), such as non-resonant or resonant light-scattering examinations with dielectric or semiconductor (e.g., silicon) metasurface structures arranged on a substrate (again, in reflection or transmission if the substrate is transparent), optical absorption examinations, optical emission examinations, etc.

Next, preferred architectures are discussed, referring to FIGS. 1 and 2. As the, the present methods are preferably performed at least partly at a server 300. The latter may, for instance, be in data communication with a set of client devices 200, 200a-200c, e.g., mobile devices. The client devices are typically in communication with optical detection devices 100, 100a-100c (e.g., CCDs), which are used to perform optical measurements, see FIGS. 1 and 2.

The server receives data S31 from each of the client devices (typically asynchronously, i.e., at different times), see FIGS. 2, 5, and 6. Each client device 200, 200a-200c is paired with a respective optical device 1, 1a-1c. Thus, the first data and the second data can be accessed by the server 300 based on the data received at step S31. This notably allows the server to identify (S32: Yes) the relevant optical device 1, based on the first data accessed, and then interpret S35 the second data according to the readout key obtained in accordance with the first data. The server may subsequently send S36 a report to the client device. For example, the server may send S36 a message that includes information as to the elucidated outcome. If the identification fails (S32: No), the server may typically invite S34 the user to redo the characterization examination, log the attempted identification, prompt the user to use of another device, and/or block further attempts, if necessary, etc.

Upstream of the user operations S20 and the server operation S30, some preliminary work needs to be performed, e.g., by the manufacturer, prior to or while commissioning the optical devices, as now described in reference to FIGS. 5 and 6. In some embodiments, the present methods comprise a series of preliminary steps, which are again performed for each of the optical devices 1, 1a-1c of the set. Such preliminary steps include fabricating S11 each optical device, for the respective arrays 21-26 to exhibit the distinct properties. Then, a readout key is devised and associated S17 to each fabricated device. As the, the readout key accounts for the specific properties of each optical device (this including the deterministic properties of the arrays and possibly the physical fingerprint too). The key may eventually be stored along with a unique identifier of each optical device, though the key may possibly serve as an identifier of the device, in variants.

After its fabrication S11, each optical device is characterized, e.g., by the manufacturer, to read out S14 the respective physical fingerprint. A corresponding digital fingerprint is accordingly obtained. The digital fingerprint is associated S17 with the identifier of the optical device and stored, to later allow the optical devices to be unambiguously identified. If this fingerprint has to impact the key, then the key must be devised by taking this into account.

All data pertaining to the optical devices may then be transferred to a dedicated database, e.g., accessible from the server 300. This database may possibly be a distributed system, preferably configured as a shared ledger. The latter may notably be configured as a blockchain, and more preferably as a business blockchain such as the so-called Hyperledger Fabric, or a similar blockchain.

As said, the readout keys accounts for individual properties of the optical devices and may possibly include effects of the physical fingerprints. Using the readout key makes it possible to restore a correct interpretation of the results obtained with the corresponding device. For example, consider two optical devices $D_1$, $D_2$ having distinct arrays, resulting in affine shifts $s_1$, $s_2$ of the readout data. For example, the respective shift functions may be $s_1(x)=2x+3$ and $s_2(x)=3x+5$. In that case, the corresponding readout keys may simply be the corresponding inverse functions, namely $x_1=(s_1-3)/2$ and $x_2=(s_2-5)/3$. Thus, readout data $\{y_1\}$ and $\{y_2\}$ as respectively obtained with the devices $D_1$, $D_2$ cannot be correctly interpreted without the corresponding keys. The example above is purposely simple; the actual readout keys are typically more sophisticated. In general, such keys can be regarded as some inverse transformations of alterations caused by the arrays. However, given that no inverse transformations may typically be analytically available for such alterations, the readout keys may have to be tabulated, or be otherwise be defined as numeric functions or algorithmic procedures. For example, they may possibly be obtained as cognitive models trained using machine learning or learned parameters of such models.

Figure 7A:
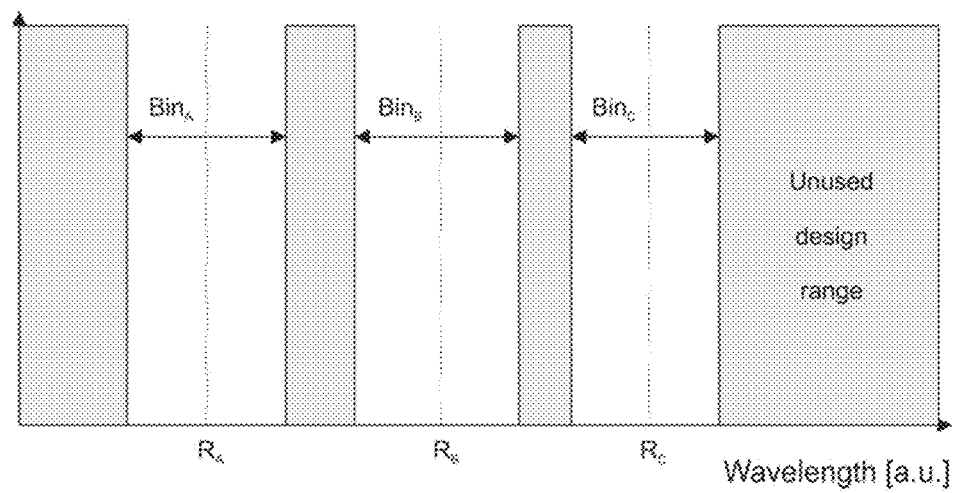
FIGS. 7A-7C show wavelength bins (i.e., intervals, see FIG. 7A), which are exploited to measure optical wavelength resonances obtained due to arrays of metasurface structures. The signals obtained (e.g., by the manufacturer, prior to or while commissioning the optical device) can be recorded and stored (FIG. 7B), in view of later authenticating the device. The signals subsequently obtained by an end user of the device allow corresponding bins to be identified, which in turn allows the optical device to be authenticated (FIG. 7C). A corresponding readout key can accordingly be identified, which is eventually used to interpret the signal values, as in some embodiments.
Figure 7B:
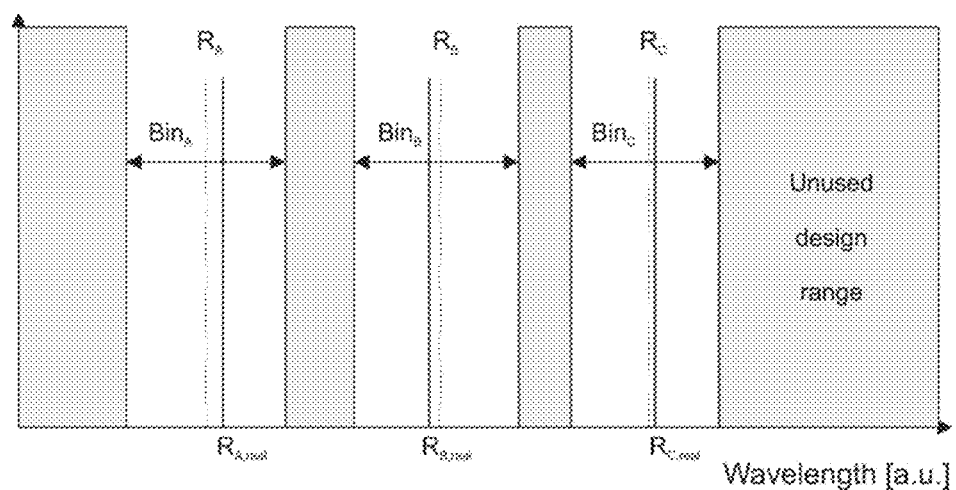
Figure 7C:
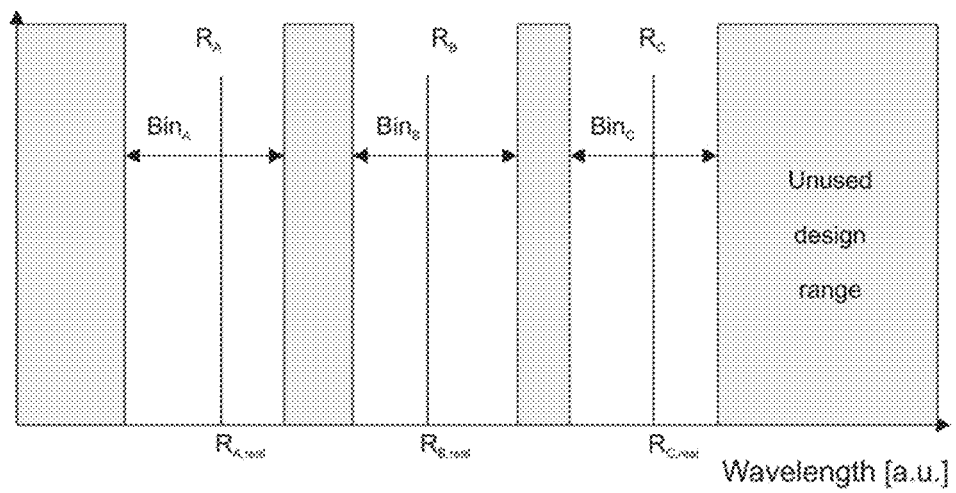

An example is now discussed in reference to FIGS. 7A-7C. FIG. 7A depicts theoretical bins as estimated for a given optical device. That is, FIG. 7A assumes that certain optical properties can be achieved by rational design for metasurface arrays of an optical device comprising multiple metasurface arrays, three in this example. The target properties may, for instance, be optical wavelength resonances. The design takes into account the fabrication process and tolerances thereof such that optical responses of the fabricated metasurfaces structures will be located in certain spectral bins (i.e., a wavelength or energy interval), where each bin is spectrally well separated from adjacent bins (in wavelength or energy). The design of the arrays further makes it possible to anticipate prohibited (unused) spectral ranges. The size of the bins is such as to account for inaccuracies in the metasurfaces fabrication (the receptor functionalization, if any), as well as shifts caused by analyte binding during the optical sensing examinations. That is, the bin widths can be estimated to make sure that actual characterization examinations will not shift the target optical properties outside the corresponding bins. Hence, the bin structure can be considered as a classification structure. The bin characteristics can serve as an identifier of the given device.

The optical device is then fabricated (FIG. 7B) to have deterministic optical properties as previously planned during the design phase. Uncontrollable fabrication inaccuracies give rise to random shifts from the intended, theoretical optical properties as predicted by design. The same holds true when metasurfaces are functionalized with receptors, as these are partly uncontrollable on the microscopic level. For example, local receptor surface densities, receptor-to-surface orientations, stacking properties, folding etc., may affect the actual optical properties of the metasurfaces. All sources of inaccuracies combine to result in optical shifts with respect to the theoretical design properties $R_i$, $i=A$, B, and C, as initially estimated (FIG. 7A). After fabrication, the optical properties (taking into account the functionalization, if any) are read out for each individual optical device. This is performed prior to commissioning the device, without exposing it to analytes. The examinational values $R_{i,real}$ obtained slightly differ from the values $R_i$. The obtained $R_{i,real}$ may for example be linked to a corresponding radio frequency identification (RFID) tag, and stored in a database.

Referring to FIG. 7C, the user now reads out the optical device, prior to using it for the sensing test with an analyte (i.e., this corresponds to steps S22, S24 in FIG. 5). This results in optical properties, which can be compared with the stored properties. The values obtained by the user may slightly change compared to the stored properties, given that the device may have undergone some slight changes (e.g., temperature may affect the molecular functionalization on the surface), hence it is advantageous to use bins (ranges) for classification purposes rather than using specific (exact) spectral data values. Still, the values obtained by the user can be recognized to belong to certain bins and, in turn, can be used to identify the device and the corresponding readout key (e.g., the bin positions and signal shifts induced by the arrays, for example).

The above example assumes that two measurements are being made by the user: a first one to identify the optical device, prior to exposing the device to analyte, and a second measurement to perform the test in the presence of analyte, as previously discussed in reference to FIG. 5.

In variants, a single characterization step may be sufficient, as assumed in FIG. 6, provided that the same type of characterization examination can be performed a first time while commissioning the optical device and a second time by the user. In that case, the outcome of this characterization examination may be impacted by both the physical fingerprint and the deterministic properties of the arrays. That is, both types of information are entangled in a single measurement.

For example, the device may be designed for each array to result in a certain, theoretical optical property, e.g., a given optical resonance in presence of a given analyte. It is possible, by design, to make sure that the ideal value of this property will fall in certain interval (a bin), as explained above. Now, some deviations shifts to the theoretical optical properties will typically be observed upon performing the characterization examination, where such shifts are the consequence of, e.g., uncontrollable non-deterministic properties due to the fabrication of the optical device. Now, the set of shifts obtained for all the arrays will typically be unique, a thing that can be leveraged to identify the device, as explained earlier in reference to FIG. 6.

The identification pattern accordingly obtained can be exploited (e.g., at a server) to identify the optical device: this pattern is associated to a unique ID, the pair {UID, identification pattern} is stored, prior to or while commissioning the device. Later, when the user utilizes the device to perform the characterization examination, the outcome of this characterization again includes deviations with respect to the ideal optical properties; such deviations are translated in an identification pattern, which is transmitted to the server. Then, a corresponding readout key is identified and used to elucidate the resonance values as measured by the user. Only one characterization measurement need be performed by the user in that case, the outcome of which entangles both types of data, i.e., the first data corresponding to the physical fingerprint and the second data corresponding to the deterministic properties.

The example in FIG. 7 assumes three arrays only, while actual chips may typically include n×n arrays, where n is typically larger than or equal to 6, in practice. The output optical signal can be read simultaneously on, e.g., a CCD detector having high energy resolution or a CMOS reader having less energy selectivity but higher spatial resolution, for example.

Referring back to FIGS. 3A and 3B, each array of each of the optical devices 1, 1a-1c preferably form a pattern of repeating cells, where each cell consists of two metasurface structures 12 each. The examples shown in FIGS. 2 and 3 assume very small arrays of 3×2 cells each (3×4 metasurface structures), for depiction purposes.

In some embodiments, the metasurface structures 12 are formed as semiconductor layer structures arranged on top of a substrate. The semiconductor structures may, for example, each have a lateral dimension that is between 1 nm and 500 nm, on average. This lateral dimension is measured parallel to the main surface of the substrate, i.e., parallel to the plane (x, z) in FIGS. 1 and 3. In some embodiments, this lateral dimension is larger than 50 nm and a standard deviation of the lateral dimension is less than 5 nm. The semiconductor structures may advantageously each have a vertical dimension that is between 10 nm and 500 nm, on average. The vertical dimension is measured perpendicular to the main surface of the substrate. In some embodiments, this vertical dimension is larger than 100 nm and a standard deviation of the vertical dimension is less than 5 nm. Fabrication methods as discussed in section allows accuracies close to a nanometer to be achieved.

Another aspect concerns a computer program product for interpreting optical characterization examinations performed with a set of optical devices 1, 1a-1c as described above. The computer program product comprises a computer readable storage medium having program instructions embodied therewith, wherein the program instructions executable by processing means (i.e., processors) to cause the latter to implement steps such as described above in respect to the present methods. Such steps may at least partly be performed (and the corresponding instructions executed) at a server 300, and may also jointly executed at the server and the connected client devices 200, 200a-200c, for example. Additional details relating to such computer program products are given in section 2.3 below. Section 2.4 further describes computerized devices as typically involved to perform the present methods.

The above embodiments have been succinctly described in reference to the accompanying drawings and may accommodate a number of variants. Several combinations of the above features may be contemplated. Examples are given in the next section.

2. SPECIFIC EMBODIMENTS—TECHNICAL IMPLEMENTATION DETAILS

2.1 Specific Embodiments

This section discloses novel types of crypto-anchors tailored for multi-analyte sensor systems as used in diagnostics to guarantee reliable, secure, and fraud-resistant (counterfeit preventing) operation. The proposed crypto-anchor concept is notably well suited for IoT diagnostics based on dielectric metasurfaces, which can benefit from a secure read-out protocol realized via a cloud.

As described in section 1, this approach combines uncontrollable, fabrication-related physical fingerprints, as well as controlled, fabrication-related embedded security features with specific receptor surface functionalizations acting as configured secrets. Such features allow a secure, cryptographic read-out of the diagnostic results via a cloud, for every single analysis/diagnostic operation performed on the analyzing devices (e.g., lab spectrometers, CMOS imager, or mobile phones), effectively preventing product counterfeiting and repeated use.

The underlying optical device is designed as a sensing chip, an arrangement of which is one comprising:

Two (or more) arrays of plasmonic or dielectric metasurfaces 12 of defined geometries (bowties, rods, ellipses, discs, etc., not stringently the same geometries), material composition (e.g., metal, highly-doped semiconductors, high-index dielectrics, 2D layered materials, not stringently the same), and/or morphology (e.g., crystalline, polycrystalline, amorphous, etc.), where each component may possibly be divided into multiple material segments; and A receptor-based surface coating with molecular compounds ensuring the functionalization, immobilized on each individual metasurface 12 that allows selective binding of analytes (e.g., upon forming chemical bonds therewith).

In some embodiments, this sensing chip additionally comprises: channel enabling analytes to be transported deterministically in either gaseous or liquid phase (or a phase mixture) to the metasurfaces arrays; and/or other gas- or liquid-handling components, such as filters, fluid-mixing elements, reagent addition components, separation components, up-concentration components, etc. Moreover, such a chip may further comprise or be connected to pumps (passive or active), tubing, tubing ports, vents, loading pads, electrical contact pads, electrical connectors (e.g., printed), etc.

The operation of the chip relies on an electro-magnetic exchange or coupling mechanism between pairs of metasurfaces, between metasurfaces and their respective receptor coatings, and/or between metasurfaces/coatings and their dielectric environment, this creating collective optical effects. In some embodiments, it additionally involves an electromagnetic or dielectric field-enhancement mechanism through resonant coupling effects (e.g., collective Mie resonators).

Such a sensing chip is being used in a sensing apparatus or system as described in the following. The sensor chip is exposed to analytes (e.g., from solution or gas phase) such that analytes can interact with corresponding receptors (the functionalization) to potentially bond at specific sites in an analyte-selective manner. The binding of the analytes changes the dielectric environment of the metasurfaces 12 which causes a shift in absorption resonance. Such a shift can be read out with very simple optical means, e.g., a narrow light source centered at the resonance of the empty receptor-metasurface layer. As most of the light is absorbed, the intensity measured on the detector is low. When analytes get bonded, the absorption resonance of the metasurfaces shifts (usually to higher wavelength) as the dielectric environment changes, and light, which was previously absorbed, is now transmitted, almost 100%, through the metasurfaces, causing much higher intensity on the detector.

For example, the chip may include metasurfaces 12 functionalized with molecular receptors, a microchannel-based gas or liquid-handling (e.g., capillary-driven) system, and an RFID chip. That is, to identify the sensing chip with an UID, a RFID chip can be affixed to the sensing chip, wherein the RFID chip can be programmed or read out.

Metasurfaces 12 can be fabricated with unprecedented accuracy, due to fabrication methods disclosed in the next sub-section, which results in unprecedented, inherent optical properties of the metasurfaces, which may be used for receptor-free and/or receptor-based sensing.

This approach allows physical fingerprints and embedded security features (in particular for metasurfaces) to be included.

As explained earlier, physical fingerprints refer to hardly controllable or uncontrollable material features, this including fabrication and/or composition variations. Variations can notably be observed in the: geometrical dimensions (length, width, thickness); material compositions (homogeneous composition, heterogeneous compositions); material morphologies; material crystallinities; and material functionalization.

While the above parameters can also be used as controllable, deterministic features to be used as embedded security features for the metasurfaces (see below), the smallest variations in nanofabrication or material compositions may already give rise to detectable changes in the optical properties of pristine metasurfaces. In turn, such properties can be characterized for each individual device and therefore be used as unique security feature, namely a physical fingerprint, that cannot easily be replicated nor discovered or reverse-engineered.

The following, non-comprehensive list provides examples of various types of inaccuracies occurring in the fabrication or material composition of dielectric metasurfaces devices, which can be exploited in the present context: material-deposition inaccuracies, e.g., sputtering, MBE or ALD growth; chemical resist inaccuracies; surface contamination; mask contamination or defects; imprint contamination or defects; dry etching inaccuracies; wet etching inaccuracies; anisotropic or isotropic effects; nucleation; crystalline defects with different etching rates; loading effects in ICP DRIE; and/or tapering.

Most of the above effects are interdependent. For example, a resist defect may affect the masking layer, as well as the subsequent transfer step that uses the mask. These undesired and uncontrollable phenomena generally occur for fabrication at true 1-nanometer scales, because controlling all these processes in conventional fabrication or composition processes on such scales is impossible to achieve. Metasurfaces, however, are very susceptible towards such inaccuracies, as their optical properties are directly affected and altered accordingly.

Fortunately, such physical fingerprints can be characterized, after fabrication, and their detection fingerprints can be characterized and stored in respect of each particular sensing chip, a thing that can later be exploited to identify such devices, as explained in section 1.

Apart from uncontrollable physical fingerprints, the underlying physical parameters can also be controlled to a large extent, giving rise to embedded security features that can be used for tailoring the properties of pristine metasurfaces and the functionalization thereof. That is, embedded security features can be achieved for metasurfaces.

As design parameters, the following parameters can be used for metasurfaces: geometrical shape (circles, triangles, ellipses, rods etc.), geometrical dimensions (length, width, thickness); material compositions (homogeneous composition, heterogeneous compositions); material stacks, material morphologies, and material crystallinities. Such properties can, in principle, be varied for each individual chip to be manufactured. However, economically, the electron-beam written master is most-often changed only in every VLSI-compatible nanoimprint master fabrication step, a requirement that depends on the level of security requirement to be achieved. For example, various masters exist and are being used in a variable way in the pick-and-place process.

The above-mentioned parameters can be varied on the level of the wafer, array, or on a sub-array level, e.g., on the level of metasurface elements. While geometry or dimensional changes as design parameters do not necessarily lead to additional costs, varying the material composition, morphology, crystallinity, etc., may be more complex and therefore more costly.

Each multi-receptor sensing chip may for example include an array of metasurfaces with different physical fingerprints and, optionally, different embedded security features each, e.g., making up a 6×6 matrix. Thus, a specific local functionalization can be used as an embedded security feature too. Such features can be changed upon depositing receptor compounds onto the metasurfaces, using a deposition process such as based on micro-drop casing, inkjet or nano electro-spraying, as well as micro- and nanofluidic deposition methods. While receptor compounds used for diagnostic tasks must be present on at least one array element for capturing corresponding analytes, additional embedded security features can be contemplated, beyond the mere variable assembly.

Additional embedded security features may for example include: receptor-empty array elements; receptor-masking compounds on array elements; non-selective receptor compounds; and redundant receptor types on other array elements, see FIGS. 2-3.

The functionalization can be varied upon assembly of the compounds on the level of the sensing chip, e.g., using a random generator. Given the large number of array elements (e.g. 6×6), the various types of molecular receptors available, and the inherent entropy of physical fingerprints used herein, a huge combinatorial power is available for creating hardware-based crypto-anchors. Receptors of a given type may be required to sense a given target analyte. Such receptors, however, can be concealed, being masked by other types of receptors, for security reasons.

Another measure can be leveraged to secure the read-out process and prevent misuse (e.g., repeated use by reselling) of the sensing device, which is to physically separate the read-out keys from the sensing devices. Such a security-feature protocol can be used as a configured secret; it can be implemented into the software required to operate the optical detectors 100, 100a-100c. A preferred protocol is the following. Via cloud, the read-out keys are granted only if certain conditions are met, which conditions can be tracked in a database, e.g., the sensing chip can duly be identified, it is confirmed that the chip has not been used before, etc. This principle enables full control over the usage of the IoT device. Depending on the application, the diagnostic result, however, may only be accessible by an authorized user, the patient, a registered physician, etc., as it is considered sensitive data.

Given the high-resolution and high-precision sensing performance achieved due to the present methods, a broad range of applications can be envisioned. General sensing applications notably include: sensing of different compounds; multiplexed sensing; medical diagnostics, drug compliance, metabolism studies, environmental monitoring; analysis of exhaled breath (volatile organic compounds, metabolites, etc.); nanochemistry with educt and product analysis; photocatalysis engineering of the sensing elements; and metabolomics.

The present optical devices (sensing chips) can be used as "mobile" devices, which are particularly suitable for most frequent usage at the point-of-care, mobile emergency diagnostics, diagnostics at home-care or mobile screening tests, by general practitioners or where a pre-doctoral anamnesis check is to be done by the patient herself/himself or where the patient herself/himself has to do very often checks (e.g. to adjust the dose of a drug according to metabolic activity) though they may also be used in diagnostic medical laboratory.

Medical diagnostic applications notably include: cardiac infarction detection; stroke detection; HIV detection; detection of sexually transmitted disease; Alzheimer plaque detection; medication compliance or adherence; medication-triggered metabolic response; and adverse drug response.

2.2 Preferred Fabrication Methods

The optical devices are preferably obtained according to a fabrication method wherein a layer structure with a semiconductor layer is processed to form metasurface structures. This fabrication method relies on a layer structure that comprises a substrate, a layer stack, and resist structures. The latter comprise, each, a resist material that includes a semiconductor element. The layer stack is arranged on top of the substrate. The resist structures form a pattern on the layer stack and can be realized by electron-beam lithography (EBL) and/or nanoimprint lithography (NIL) methods. The layer stack comprises: a semiconductor layer (arranged on top of the substrate); a protective layer (arranged on top of the semiconductor layer); and a transfer layer (arranged on top of the protective layer). The protective layer preferably comprises $Al_xO_y$, while the transfer layer may for instance comprise $SiO_2$. The layer structure may for example be obtained by forming the layer stack on top of the substrate, wherein the protective layer is deposited using a process such as atomic-layer deposition, chemical vapor deposition, sputtering, etc.

Exposed portions of the transfer layer are removed by selectively etching the transfer layer. The exposed portions are unmasked portions, i.e., portions that are not masked by the resist structures. After removing the exposed portions, residual portions of the transfer layer remain between the protective layer and the resist structures. Note, a selective etching process is an etching process which is selective with respect to the material to be removed (the transfer layer in the above case), meaning that the target material is removed much more efficiently than other exposed materials. The selectivity for the etching processes typically range between 100 and 10,000.

Next, the resist structures are entirely removed by another selective etching process. This results in exposing transfer layer structures, which are formed by the residual portions of the transfer layer. The transfer layer structures are then transferred into the protective layer by selectively etching the latter, using a further selective etching process. This way, combined portions of residual layer portions are obtained, which comprise, each, a residual portion of the protective layer and a residual portion of the transfer layer.

After that, the semiconductor layer is selectively etched to obtain residual semiconductor structures. For example, the semiconductor layer is selectively etched using an inductively coupled plasma process, preferably based on $BCl_3$. At this point, the residual semiconductor structures are still masked by the combined portions of residual layer portions as previously obtained. Therefore, the combined portions are finally removed entirely by selectively etching the combined portions. This results in exposing the semiconductor structures. This way, metasurface structures are obtained, which are arranged according to the pattern as initially formed by the resist structures on the initial layer stack. The above fabrication method may, for example, be performed to obtain a flat-optical element, metasurfaces of which are formed by the semiconductor structures.

The above fabrication method relies on an indirect transfer process, which results in unprecedently accurate and clean metasurface structures. This is made possible due to successive, selective etching steps in a multi-step, multilayer approach, which notably allows the resist structures to be removed, while keeping the semiconductor layer protected, even though the resist material comprises a semiconductor element. Still, the above approach is compatible with both nanoimprint lithography (NIL) and electron-beam lithography (EBL) methods. Thus, the resist structures may initially be obtained using a NIL process or an EBL process. The mold used to obtain the initial resist structures may thus be used multiple times when using NIL, making the present methods compatible with mass fabrication and operational at much lower costs than sequential EBL-patterning alone.

2.3 Computer Program Products

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the C programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

2.4 Example of Suitable Computerized Units

Computerized devices can be suitably designed for implementing embodiments of the present invention as described herein. For instance, one or more computerized units may be involved, each including a general-purpose computer. In exemplary embodiments, in terms of hardware architecture, this unit may include a processor, a memory coupled to a memory controller, and one or more input and/or output (I/O) devices (or peripherals) that are communicatively coupled via a local input/output controller. The input/output controller can be, but is not limited to, one or more buses or other wired or wireless connections, as is known in the art. The input/output controller may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor is a hardware device for executing software, particularly that stored in memory. The processor can be any custom made or commercially available processor, a central processing unit (CPU), an auxiliary processor among several processors associated with the computer, a semiconductor-based microprocessor (in the form of a microchip or chip set), or generally any device for executing software instructions.

The memory can include any one or combination of volatile memory elements (e.g., random access memory) and nonvolatile memory elements. Moreover, the memory may incorporate electronic, magnetic, optical, and/or other types of storage media. Note that the memory can have a distributed architecture, where various components are situated remote from one another, but can be accessed by the processor.

The software in memory may include one or more separate programs, each of which comprises an ordered listing of executable instructions for implementing logical functions. In particular, the software in the memory may include methods described herein in accordance with exemplary embodiments and a suitable operating system (OS). The OS essentially controls the execution of other computer programs and provides scheduling, input-output control, file and data management, memory management, and communication control and related services.

The methods described herein may be in the form of a source program, executable program (object code), script, or any other entity comprising a set of instructions to be performed. When in a source program form, then the program needs to be translated via a compiler, assembler, interpreter, or the like, as known per se, which may or may not be included within the memory, to operate properly in connection with the OS. Furthermore, the methods can be written as an object-oriented programming language, which has classes of data and methods, or a procedure programming language, which has routines, subroutines, and/or functions.

Possibly, a conventional keyboard and mouse can be coupled to the input/output controller. Other I/O devices may include other hardware devices.

In addition, the I/O devices may include devices that communicate both inputs and outputs. The computerized system can further include a display controller coupled to a display. In exemplary embodiments, the system can further include a network interface or transceiver for coupling to a network. The network transmits and receives data between the computerized unit and external systems. The network is possibly implemented in a wireless fashion, e.g., using wireless protocols and technologies, such as WiFi, WiMax, etc. The network may be a fixed wireless network, a wireless local area network (LAN), a wireless wide area network (WAN) a personal area network (PAN), a virtual private network (VPN), intranet or other suitable network system and includes equipment for receiving and transmitting signals.

The network can also be an IP-based network for communication between a given unit and any external server, client and the like via a broadband connection. In exemplary embodiments, network can be a managed IP network administered by a service provider. Besides, the network can be a packet-switched network such as a LAN, WAN, Internet network, etc.

If the unit is a PC, workstation, intelligent device or the like, the software in the memory may further include a basic input output system (BIOS). The BIOS is stored in ROM so that the BIOS can be executed when the computer is activated.

When the unit is in operation, the processor is configured to execute software stored within the memory, to communicate data to and from the memory, and to generally control operations of the computer pursuant to the software. The methods described herein and the OS, in whole or in part are read by the processor, typically buffered within the processor, and then executed. When the methods described herein are implemented in software, the methods can be stored on any computer readable medium, such as storage, for use by or in connection with any computer related system or method.

Cloud Computing in General

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as Follows

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as Follows

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as Follows

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 8A:
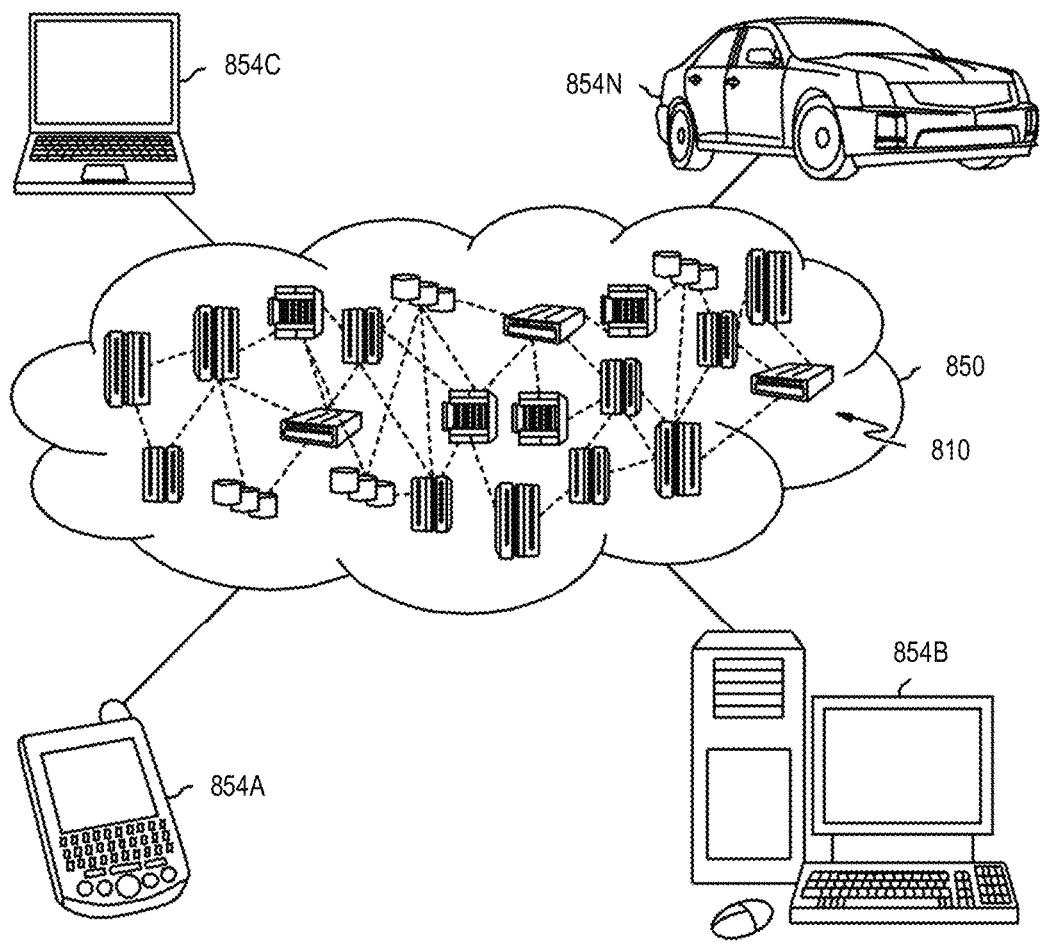
FIG. 8A depicts a cloud computing environment according to an embodiment of the present invention.

Referring now to FIG. 8A, illustrative cloud computing environment 850 is depicted. As shown, cloud computing environment 850 includes one or more cloud computing nodes 810 with which local computing devices used by cloud consumers, such as, for example, personal digital assistant (PDA) or cellular telephone 854A, desktop computer 854B, laptop computer 854C, and/or automobile computer system 854N may communicate. Nodes 810 may communicate with one another. They may be grouped (not shown) physically or virtually, in one or more networks, such as Private, Community, Public, or Hybrid clouds as described hereinabove, or a combination thereof. This allows cloud computing environment 850 to offer infrastructure, platforms and/or software as services for which a cloud consumer does not need to maintain resources on a local computing device. It is understood that the types of computing devices 854A-N shown in FIG. 8 are intended to be illustrative only and that computing nodes 810 and cloud computing environment 850 can communicate with any type of computerized device over any type of network and/or network addressable connection (e.g., using a web browser).

Figure 8B:
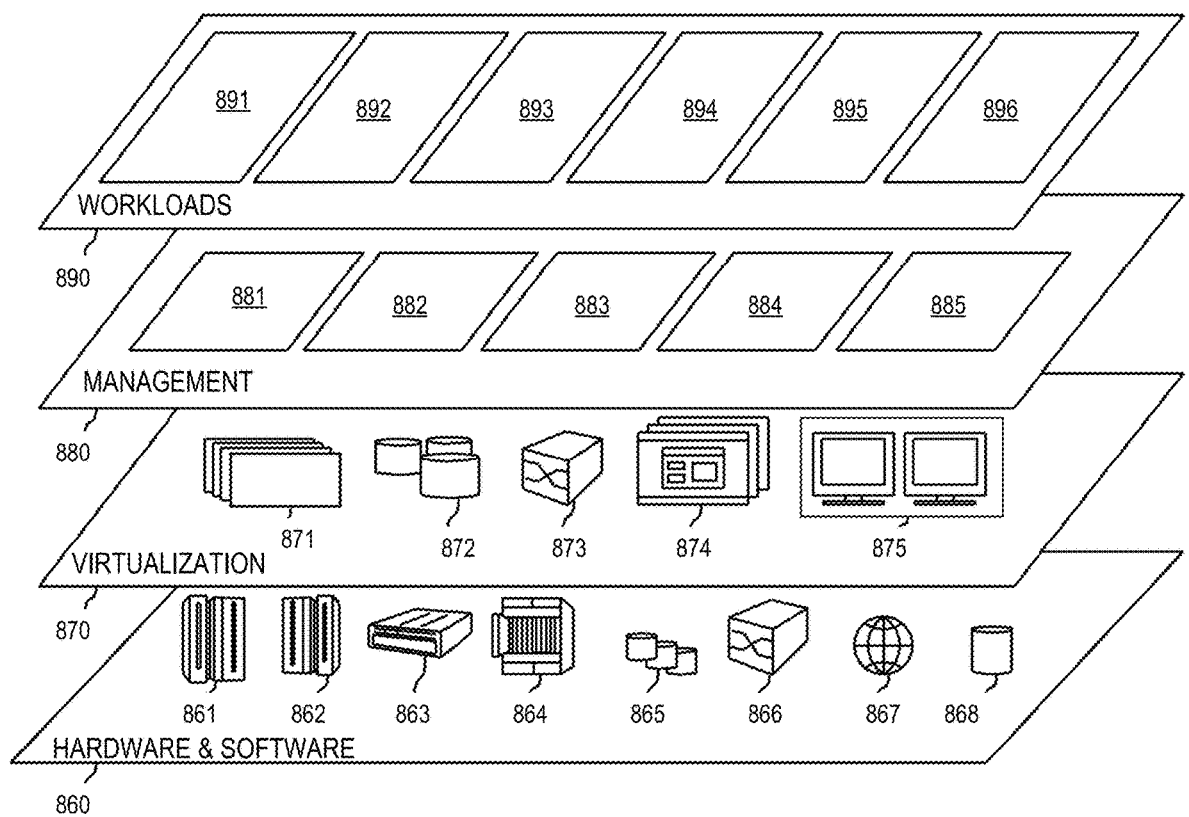
FIG. 8B depicts abstraction model layers according to an embodiment of the present invention.

Referring now to FIG. 8B, a set of functional abstraction layers provided by cloud computing environment 850 (FIG. 8A) is shown. It should be understood in advance that the components, layers, and functions shown in FIG. 8B are intended to be illustrative only and embodiments of the invention are not limited thereto. As depicted, the following layers and corresponding functions are provided:

Hardware and software layer 860 includes hardware and software components. Examples of hardware components include: mainframes 861; RISC (Reduced Instruction Set Computer) architecture based servers 862; servers 863; blade servers 864; storage devices 865; and networks and networking components 866. In some embodiments, software components include network application server software 867 and database software 868.

Virtualization layer 870 provides an abstraction layer from which the following examples of virtual entities may be provided: virtual servers 871; virtual storage 872; virtual networks 873, including virtual private networks; virtual applications and operating systems 874; and virtual clients 875.

In one example, management layer 880 may provide the functions described below. Resource provisioning 881 provides dynamic procurement of computing resources and other resources that are utilized to perform tasks within the cloud computing environment. Metering and Pricing 882 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 883 provides access to the cloud computing environment for consumers and system administrators. Service level management 884 provides cloud computing resource allocation and management such that required service levels are met. Service Level Agreement (SLA) planning and fulfillment 885 provide pre-arrangement for, and procurement of, cloud computing resources for which a future requirement is anticipated in accordance with an SLA.

Workloads layer 890 provides examples of functionality for which the cloud computing environment may be utilized. Examples of workloads and functions which may be provided from this layer include: mapping and navigation 891; software development and lifecycle management 892; virtual classroom education delivery 893; data analytics processing 894; transaction processing 895; and mobile desktop 896.

It is to be understood that although this disclosure refers to cloud computing, implementation of the teachings recited herein are not limited to a cloud computing environment. Rather, embodiments of the present invention are capable of being implemented in conjunction with any other type of computing environment now known or later developed. Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated.

What is claimed is:

1. A method for examining a set of devices:
wherein each of the set of devices:
comprises one or more arrays of optical metasurface structures; and
has respective arrays having distinct properties;
the method comprising, for each device of the set:
accessing first data and second data that capture a physical fingerprint of each device and an outcome of an optical characterization examination performed with each device, respectively, wherein the outcome is impacted by a respective one of the distinct properties;
identifying each device based on the first data accessed to obtain a readout key associated with the identified device, the readout key accounting for the respective one of the distinct properties;
interpreting the second data according to the readout key to elucidate the outcome of the optical characterization examination; and
sending, to an examining device, the outcome of the optical characterization examination.

2. The method according to claim 1, wherein:
the outcome is impacted by both the respective one of the distinct properties and the physical fingerprint of each device;
the readout key accounts for both the respective one of the distinct properties and the physical fingerprint of each device; and
accessing the first and second data comprises:
receiving characterization data; and determining the first and second data based on the characterization data received, in view of identifying each device to obtain the associated readout key and interpreting the second data according to the readout key obtained.

3. The method according to claim 2, wherein the physical fingerprint is an unclonable property of the one or more arrays of each device.

4. The method according to claim 1, wherein the devices of the set each comprise two or more arrays of metasurface structures having the distinct properties in order for the devices of the set to differ from each other.

5. The method according to claim 4, wherein:
the metasurface structures of at least one of the arrays of each device are coated with substances for selectively binding analytes, the substances forming respective functionalization patterns for the arrays of the devices;
the outcome captured by the second data is, for each device, impacted by both the metasurface structures of the respective arrays of each device and a respective one of the functionalization patterns; and
the readout key accounts for the respective one of the functionalization patterns.

6. The method according to claim 5, wherein the substances comprise molecular receptors for selectively binding the analytes, the metasurface structures of at least one of the arrays of each device are coated with the molecular receptors, in order for the arrays of the devices to be functionalized according to respective functionalization patterns formed by the molecular receptors.

7. The method according to claim 6, wherein two or more of the arrays of each device are coated with distinct types of molecular receptors for selectively binding distinct types of analytes.

8. The method according to claim 6, wherein the receptors are formed as molecular compounds immobilized on a surface of the one or more metasurface structures, and the molecular compounds each comprise several moieties, including a first moiety anchored to the surface, and a second moiety, which is a receptor chemically connected via a backbone to the first anchoring moiety.

9. The method according to claim 8, wherein:
the several moieties further comprise a third moiety that is a protection moiety for acetylene, the protection moiety bonded to an acetylene unit of the backbone of each of the molecular compounds via an electrochemically breakable bond; and
the method further comprises deprotecting acetylene units of backbones of the molecular compounds by electrochemically cleaving protection moieties thereof, prior to binding the molecular receptors to the deprotected acetylene units.

10. The method according to claim 1, wherein the outcome of the optical characterization examination comprises optical data representing a spectral response of each device.

11. The method according to claim 10, further comprising, for each device and prior to accessing first data and second data, performing the optical characterization examination by illuminating each array of each device with electromagnetic radiation, at a frequency that matches a resonance frequency of the metasurface structures of the array in absence of analytes.

12. The method according to claim 10, wherein the spectral response is a response to electromagnetic radiation transmitted through each device, the spectral response reflecting changes of absorption resonance caused by an effective change in a dielectric environment of the metasurface structures in one or more of the arrays of the device.

13. The method according to claim 1, wherein:
the method is performed at a server, which is in data communication with a set of client devices; and
the method further comprises, for each device and prior to accessing the first data and second data, receiving data from one of the client devices that is paired with each device, the first data and the second data being accessible by the server based on the data received, for the server to identify each device based on the first data accessed and interpret the second data according to the readout key accordingly obtained.

14. The method according to claim 13, further comprising, after having identified each device and interpreted the second data to elucidate the outcome of the optical characterization examination, sending a message to the one of the client devices, the message including information as to the elucidated outcome.

15. The method according to claim 1, further comprising, for each device of the set, and prior to accessing the first data and the second data for any of the devices of the set:
fabricating each device, for the one or more arrays of each device to have a respective one of the distinct properties; and
associating the readout key for the respective one of the distinct properties with an identifier of each device.

16. The method according to claim 15, further comprising, after fabricating each device and prior to accessing the first data and the second data for any of the devices of the set, reading out the physical fingerprint of each device, to obtain a digital fingerprint corresponding to the physical fingerprint, and associating the digital fingerprint with the identifier of each device.

17. The method according to claim 1, wherein each array of each of the devices comprises a pattern of repeating cells of two metasurface structures each.

18. The method according to claim 1, wherein:
the metasurface structures are formed as semiconductor layer structures arranged on top of a substrate; and
the semiconductor structures have, each, a lateral dimension that is between 1 nm and 500 nm, on average, the lateral dimension being measured parallel to a main surface of the substrate.

19. The method according to claim 18, wherein the semiconductor structures each have a vertical dimension that is between 10 nm and 500 nm, on average, and a standard deviation of the vertical dimension is less than 5 nm, the vertical dimension being measured perpendicular to the main surface of the substrate.

20. A computer program product for interpreting optical characterization examinations performed with a set of devices, each comprising one or more arrays of electromagnetic metasurface structures, wherein the devices are tailored, such that their respective arrays have distinct properties, wherein the computer program product comprises a computer readable storage medium having program instructions embodied therewith, the program instructions executable by processing means to cause the latter, for each device of the set, to:
access first data and second data, which capture a physical fingerprint of each device and an outcome of an optical characterization examination performed with each device, respectively, wherein the outcome is impacted by a respective one of the distinct properties;
identify each device based on the first data accessed, to obtain a readout key associated with the identified device, the readout key accounting for the respective one of the distinct properties;
interpret the second data according to the readout key to elucidate the outcome of the optical characterization examination;
send, to an examining device, the outcome of the optical characterization examination.

* * * * *